(12) United States Patent
Maejima

(10) Patent No.: US 9,711,226 B2
(45) Date of Patent: Jul. 18, 2017

(54) SEMICONDUCTOR MEMORY DEVICE

(71) Applicant: KABUSHIKI KAISHA TOSHIBA, Tokyo (JP)

(72) Inventor: Hiroshi Maejima, Setagaya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/055,250

(22) Filed: Feb. 26, 2016

(65) Prior Publication Data
US 2016/0260487 A1 Sep. 8, 2016

(30) Foreign Application Priority Data
Mar. 4, 2015 (JP) .................................. 2015-42540

(51) Int. Cl.
| G11C 11/34 | (2006.01) |
| G11C 16/14 | (2006.01) |
| H01L 27/11524 | (2017.01) |
| H01L 27/11526 | (2017.01) |
| H01L 27/1157 | (2017.01) |
| H01L 27/11573 | (2017.01) |
| G11C 16/16 | (2006.01) |
| H01L 27/11582 | (2017.01) |
| G11C 16/26 | (2006.01) |
| G11C 16/10 | (2006.01) |

(52) U.S. Cl.
CPC ............. *G11C 16/14* (2013.01); *G11C 16/16* (2013.01); *H01L 27/1157* (2013.01); *H01L 27/11524* (2013.01); *H01L 27/11526* (2013.01); *H01L 27/11573* (2013.01); *H01L 27/11582* (2013.01); *G11C 16/10* (2013.01); *G11C 16/26* (2013.01)

(58) Field of Classification Search
CPC ......... G11C 16/14; G11C 16/16; G11C 16/10; G11C 16/26; H01L 27/11524; H01L 27/11526; H01L 27/1157; H01L 27/11573
USPC ............ 365/185.26, 185.01, 185.03, 185.05, 365/185.06, 185.11, 185.16, 185.17, 365/185.22, 185.23
See application file for complete search history.

(56) References Cited

U.S. PATENT DOCUMENTS

| 7,852,675 | B2 | 12/2010 | Maejima |
| 8,223,525 | B2 | 7/2012 | Balakrishnan et al. |
| 8,233,323 | B2 | 7/2012 | Hishida et al. |
| 8,288,816 | B2 | 10/2012 | Komori et al. |
| 8,372,720 | B2 | 2/2013 | Fukuzumi et al. |
| 8,514,627 | B2 | 8/2013 | Itagaki et al. |
| 8,531,901 | B2 | 9/2013 | Ogiwara et al. |
| 8,952,426 | B2 | 2/2015 | Maejima |
| 9,111,592 | B2 | 8/2015 | Maejima |
| 2011/0141788 | A1 | 6/2011 | Balakrishnan et al. |
| 2011/0215394 | A1 | 9/2011 | Komori et al. |
| 2011/0284946 | A1 | 11/2011 | Kiyotoshi |

(Continued)

*Primary Examiner* — Fernando Hidalgo
(74) *Attorney, Agent, or Firm* — Patterson & Sheridan, LLP

(57) ABSTRACT

A semiconductor memory device includes a first well of a first conductivity type, a memory cell array including a plurality of memory cells stacked above the first well, the memory cells including a first memory cell transistor, a first wiring above the memory cells array and electrically connected to the first memory cell transistor, and a controller configured to execute an erase operation in which an erase voltage is applied to the first wiring while the first well is in an electrically floating state.

17 Claims, 26 Drawing Sheets

(56) References Cited

U.S. PATENT DOCUMENTS

2012/0057405 A1    3/2012  Ogiwara et al.
2012/0320652 A1   12/2012  Kono
2015/0325301 A1*  11/2015  Nam .................. G11C 16/0483
                                              365/185.11

* cited by examiner

| | SL | | S/A | | Signal | | | | | | |
|---|---|---|---|---|---|---|---|---|---|---|---|
| | SL<0> | SL<1> | VHSA | VLSA | SW_S0VH | SW_S1VH | SW_S0VL | SW_S1VL | VDDSA_SW | VSSSA_SW | VERA_SW |
| Read/Verify | VSS | VDDSA | VDDSA | VSS | "L" | "H" | "H" | "L" | "H" | "H" | "L" |
| Program | VDDSA | VSS | VDDSA | VSS | "H" | "L" | "L" | "H" | "H" | "H" | "L" |
| Erase | VERA | VERA | "floating" | | "floating" | | | | "L" | "L" | "H" |

↑ INCLUDE SELECTED BLOCK

FIG. 16

| | SL | | S/A | | | Signal | | | | | | | |
|---|---|---|---|---|---|---|---|---|---|---|---|---|---|
| | SL⟨0⟩ | SL⟨1⟩ | VHSA | VLSA | SW_S0VH | SW_S1VH | SW_S0VL | SW_S1VL | VDDSA_SW | VSSSA_SW | VERA_SW |
| Read/Verify | VDDSA | VSS | VHSA | VSS | "H" | "L" | "L" | "H" | "H" | "H" | "L" |
| Program | VSS | VDDSA | VDDSA | VSS | "L" | "H" | "H" | "L" | "H" | "H" | "L" |
| Erase | VERA | VERA ← INCLUDE SELECTED BLOCK | VDDSA | "floating" | "floating" | | | | "L" | "L" | "H" |

SEMICONDUCTOR MEMORY DEVICE

CROSS-REFERENCE TO RELATED APPLICATION

This application is based upon and claims the benefit of priority from Japanese Patent Application No. 2015-42540, filed on Mar. 4, 2015, the entire contents of which are incorporated herein by reference.

FIELD

Embodiments described herein relate generally to a semiconductor memory device.

BACKGROUND

A NAND flash memory in which a memory cell transistor is arranged three-dimensionally is known in the art.

DESCRIPTION OF THE DRAWINGS

FIG. 16 is a table illustrating a state of the source line of the semiconductor memory device according to the third embodiment, the power-supply line of the sense amplifier, and the signal line of the driver.

DETAILED DESCRIPTION

Figure 1:
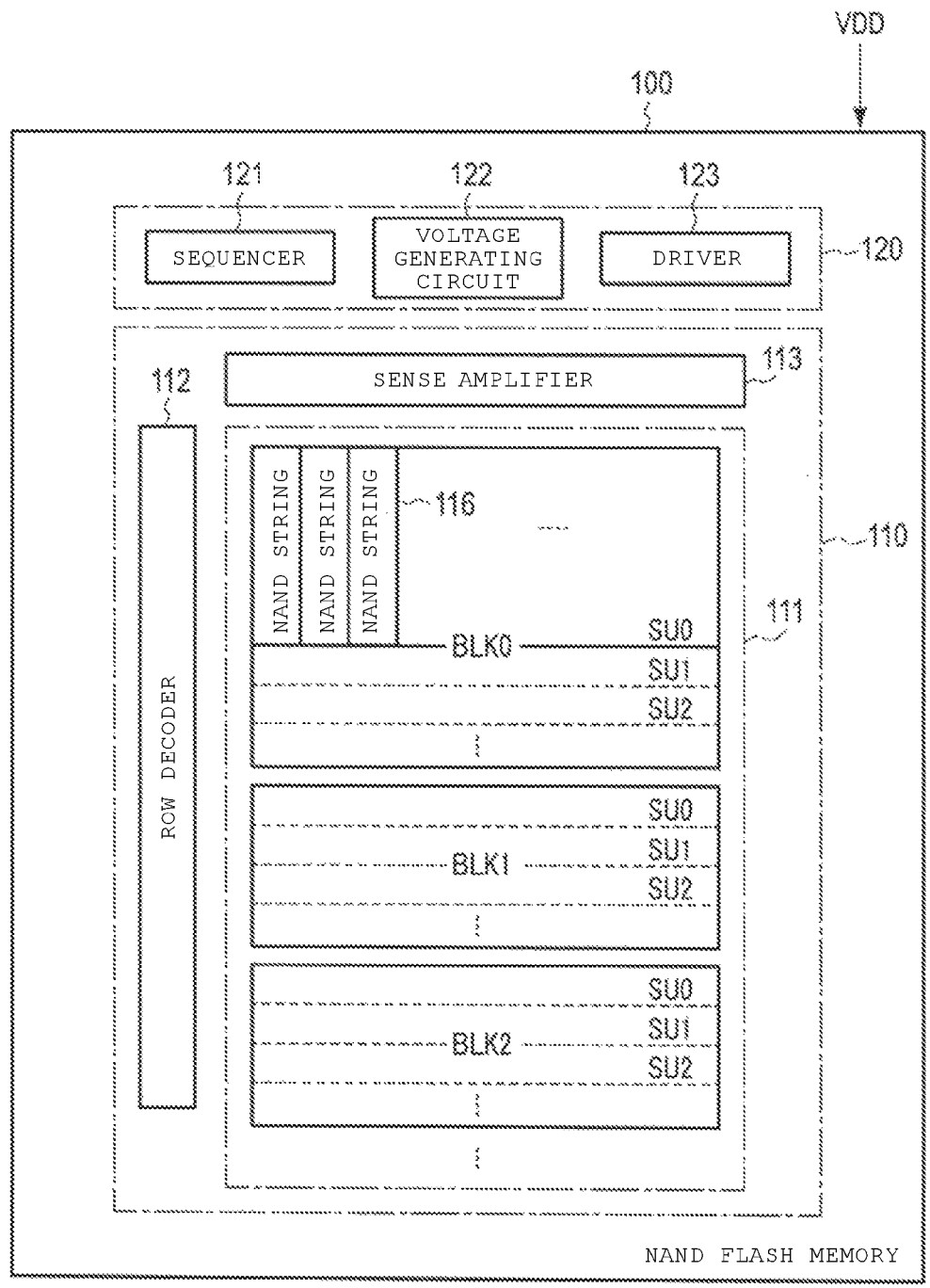
FIG. 1 is a block diagram illustrating a semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

An embodiment provides a semiconductor memory device by which the power consumption is able to be reduced.

According to an aspect of an exemplary embodiment, a semiconductor memory device includes a first well of first conductivity type, a memory cell array including a plurality of memory cells stacked above the first well, the memory cells including a first memory cell transistor, a first wiring above the memory cells array and electrically connected to the first memory cell transistor, and a controller configured to execute an erase operation in which an erase voltage is applied to the first wiring while the first well is in an electrically floating state.

Hereinafter, embodiments will be described with reference to the drawings. In this description, the same reference numerals are given to the same parts depicted in the drawings.

1. First Embodiment

A semiconductor memory device according to a first embodiment will be described. Hereinafter, as the semiconductor memory device, a three-dimensionally layered NAND flash memory in which memory cell transistors are stacked on a semiconductor substrate will be described as an example.

1.1 Configuration 1.1.1 Overall Configuration of Semiconductor Memory Device

First, an overall configuration of the semiconductor memory device will be described with reference to FIG. 1. A NAND flash memory 100 is controlled by an external controller (not illustrated), and is operated when supplied with a power-supply voltage VDD (for example, 3.3 V) from the controller. As illustrated, the NAND flash memory 100 generally includes a core section 110 and a peripheral circuit 120.

The core section includes a memory cell array 111, a row decoder 112, and a sense amplifier 113.

The memory cell array 111 includes a plurality of blocks BLK (BLK0, BLK1, . . . ) which is an assembly of a plurality of nonvolatile memory cell transistors. Each of the blocks BLK includes a plurality of string units SU (SU0, SU1, . . . ) which is an assembly of the memory cell transistors respectively associated with a word line and a bit line. Each of the string units SU includes a plurality of NAND strings 116 in each of which memory cell transistors are connected in series. Obviously, the number of NAND strings 116 is arbitrarily determined. The detail of the memory cell array 111 will be described below.

When the data is written and read, the row decoder 112, for example, selects a word line corresponding to a page which is a target by decoding the address of the block BLK or the address of the page. Then, the row decoder 112 applies a suitable voltage to a selected word line and a non-selected word line.

When the data is read, the sense amplifier 113 senses the data read in the bit line from the memory cell transistor. In addition, when the data is written, the sense amplifier 113 transmits the write data to the memory cell transistor.

The peripheral circuit 120 includes a sequencer 121, a voltage generating circuit 122, and a driver 123.

The sequencer 121 controls the operations of the NAND flash memory 100.

The voltage generating circuit 122 generates a voltage necessary for writing, reading, and erasing data by increasing or decreasing the power-supply voltage VDD, and supplies the voltage to the driver 123.

The driver 123 supplies the voltage generated by the voltage generating circuit 122 to the row decoder 112, the sense amplifier 113, a source line (not illustrated), a well, and the like.

1.1.2 Circuit Configuration of Memory Cell Array

Figure 2:
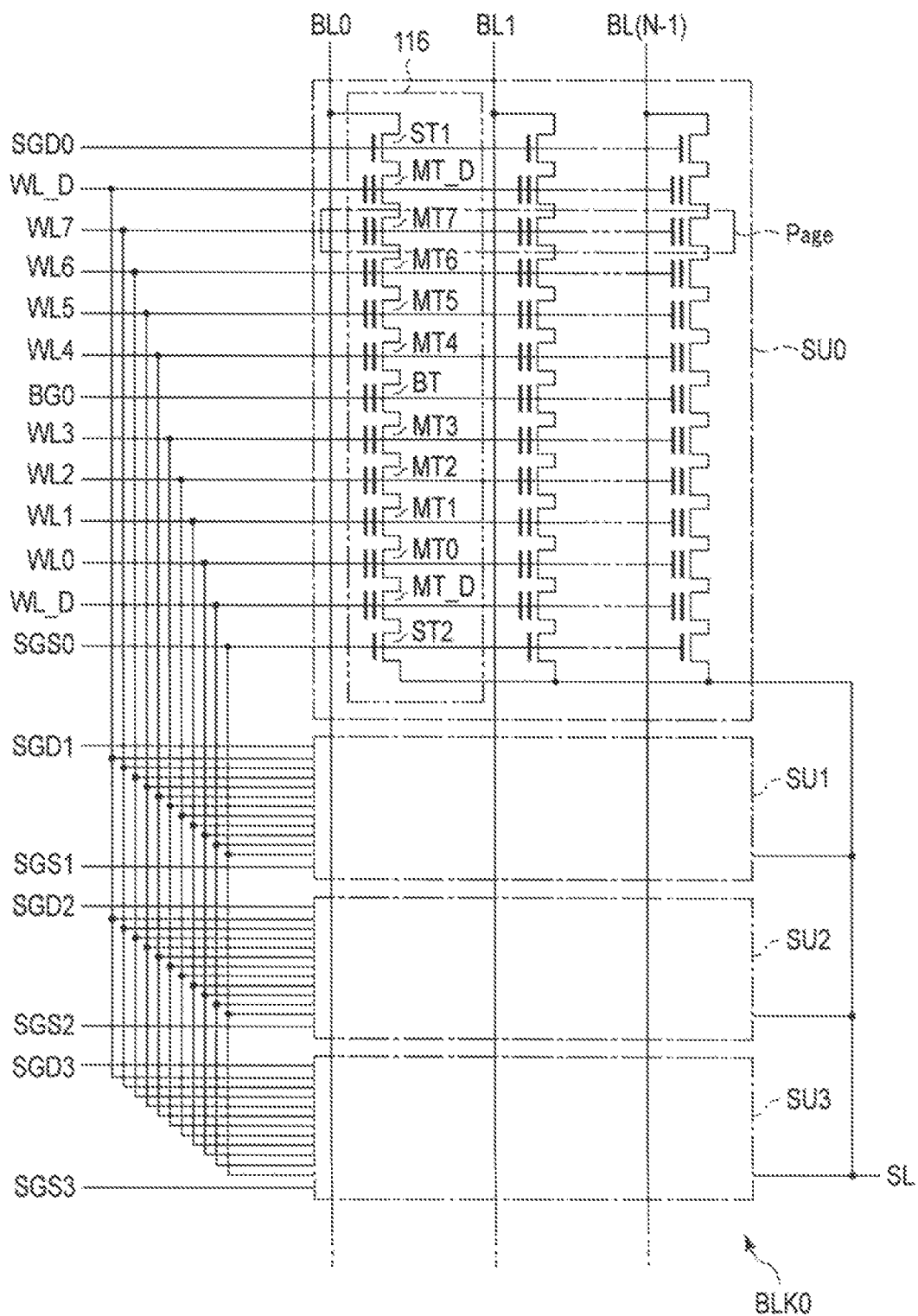
FIG. 2 is a circuit diagram illustrating a memory cell array provided in the semiconductor memory device according to the first embodiment.

Next, a circuit configuration of the memory cell array 111 will be described with reference to FIG. 2.

As illustrated, the block BLK, for example block BLK0, includes four string units SU including a NAND string 116. Data of a memory cell transistor MT in the same block BLK, for example, is collectively erased. Furthermore, an erasing range of the data is not limited to one block BLK, and a plurality of blocks BLK may be collectively erased, or just a part of a region in one block BLK may be collectively erased.

The erasing of data, for example, is disclosed in U.S. patent application Ser. No. 12/694,690, filed on Jan. 27, 2010 with the title of "Nonvolatile Semiconductor Memory Device." In addition, the erasing of the data is disclosed in U.S. patent application Ser. No. 13/235,389, filed on Sep. 18, 2011 with the title of "Nonvolatile Semiconductor Memory Device." The entire contents of these patent applications are incorporated herein by reference.

In contrast, the reading and writing of the data in this embodiment are collectively performed with respect to a plurality of memory cell transistors MT connected in common to any one word line WL in any one string unit SU of any one block BLK. Hereinafter, the unit of the data which is collectively read or written is referred to as a "page".

Each of the NAND strings 116 includes the memory cell transistor MT (MT0 to MT7), a dummy memory cell transistor MT_D, select transistors ST1 and ST2, and a back gate transistor BT, and these components are connected in series. Furthermore, the number of transistors is arbitrarily determined, and the dummy memory cell transistor MT_D may be omitted.

A gate of each of the select transistors ST1 in the same string unit SU is connected to the same select gate line SGD, and a gate of each of the select transistors ST2 in the same string unit SU is connected to the same select gate line SGS. The memory cell transistors MT0 to MT7 in the same block BLK are respectively connected to the same word lines WL0 to WL7, and a control gate of the back gate transistor BT in the same block BLK is connected to the same back gate line BG.

The select transistor ST1 of the NAND string 116 in the same column across the plurality of blocks string units SU and the plurality of blocks BLK is connected to the same bit line BL (any one of BL0 to BL (N−1), N is a natural number of greater than or equal to 1). In addition, all of the NAND strings 116 across the plurality of blocks BLK are connected to the same source line SL.

1.1.3 Sectional Configuration of Memory Cell Array and Semiconductor Substrate

Next, the sectional configuration of the memory cell array 111 and the semiconductor substrate will be described in detail with reference to FIG. 3.

As illustrated, an n type well 21 is arranged in the vicinity of a surface of a p type semiconductor substrate 20, and an element region 23 (Active Area: AA) which is separated by an element separation region (not illustrated) is arranged in a surface region of the n type well 21. Furthermore, in an example of FIG. 3, a transistor is not formed on the element region 23. Further, the element region 23 may be an n type well or a p type well.

In addition, an n+ diffusion layer 25 is arranged in a surface region of the n type well 21, and is connected to a wiring layer 28 through a contact plug 26. The wiring layer 28 functions as well wiring CNWELL which transmits a voltage supplied by the driver 123 to the n type well 21. In addition, a p+ diffusion layer 24 is arranged on the semiconductor substrate 20, and is connected to a wiring layer 29 through a contact plug 27. The wiring layer 29 functions as wiring CSUB which transmits a voltage supplied by the driver 123 to the semiconductor substrate 20.

An insulating film (not illustrated) is formed on the semiconductor substrate 20, and the memory cell array 111 is form on an upper portion of the insulating film (not illustrated). Specifically, a wiring layer 30 which functions as the back gate line BG, a wiring layer 32 which functions as the word line WL and the dummy word line WL_D, and a wiring layer 33 which functions as the select gate line SGS or a wiring layer 34 which functions as the select gate line SGD are sequentially arranged along a first direction perpendicular to the surface of the semiconductor substrate 20. Then, semiconductor layers 31a and 31b which are a current path of the NAND string 116 are in the shape of U, and both ends of the current path are respectively connected to a wiring layer 35 which functions as the source line SL and a wiring layer 36 which functions as the bit line BL. Then, wiring layers 37 and 38 are formed on an upper portion of the wiring layer 36. Hereinafter, in this embodiment, a region on a lower portion of the memory cell array 111 in the first direction is referred to as a "region 150". In addition, a case will be described as an example in which the wiring layer 37 functions as a global source line GSL connecting the driver 123 to the source line SL, and the wiring layer 38 functions as a transmission line FT transmitting a voltage or a signal to the n type well 21 or the element region 23. Accordingly, the global source line GSL is connected to the source line SL in a region (not illustrated), and the transmission line FT is connected to the well wiring CNWELL or the element region 23 in a region (not illustrated).

The embodiments may also employ a configuration of the memory cell array 111 disclosed in U.S. patent application Ser. No. 12/407,403, filed on Mar. 19, 2009 with the title of "Three-Dimensionally Stacked Nonvolatile Semiconductor Memory," the configuration of the memory cell array 111 disclosed in U.S. patent application Ser. No. 12/406,524, filed on Mar. 18, 2009 with the title of "Three-Dimensionally Stacked Nonvolatile Semiconductor Memory," U.S. patent application Ser. No. 12/679,991, filed on Mar. 25, 2010 with the title of "Nonvolatile Semiconductor Memory Device And Manufacturing Method Thereof," and U.S. patent application Ser. No. 12/532,030, filed on Mar. 23, 2009 with the title of "Semiconductor Memory And Manufacturing Method Thereof." The entire contents of these patent applications are incorporated herein by reference.

1.1.4 Configuration of Sense Amplifier

Next, the configuration of the sense amplifier 113 will be described with reference to FIG. 4. In this embodiment, a current sense type sense amplifier 113 which senses a current flowing through the bit line BL will be described as an example.

Figure 4:
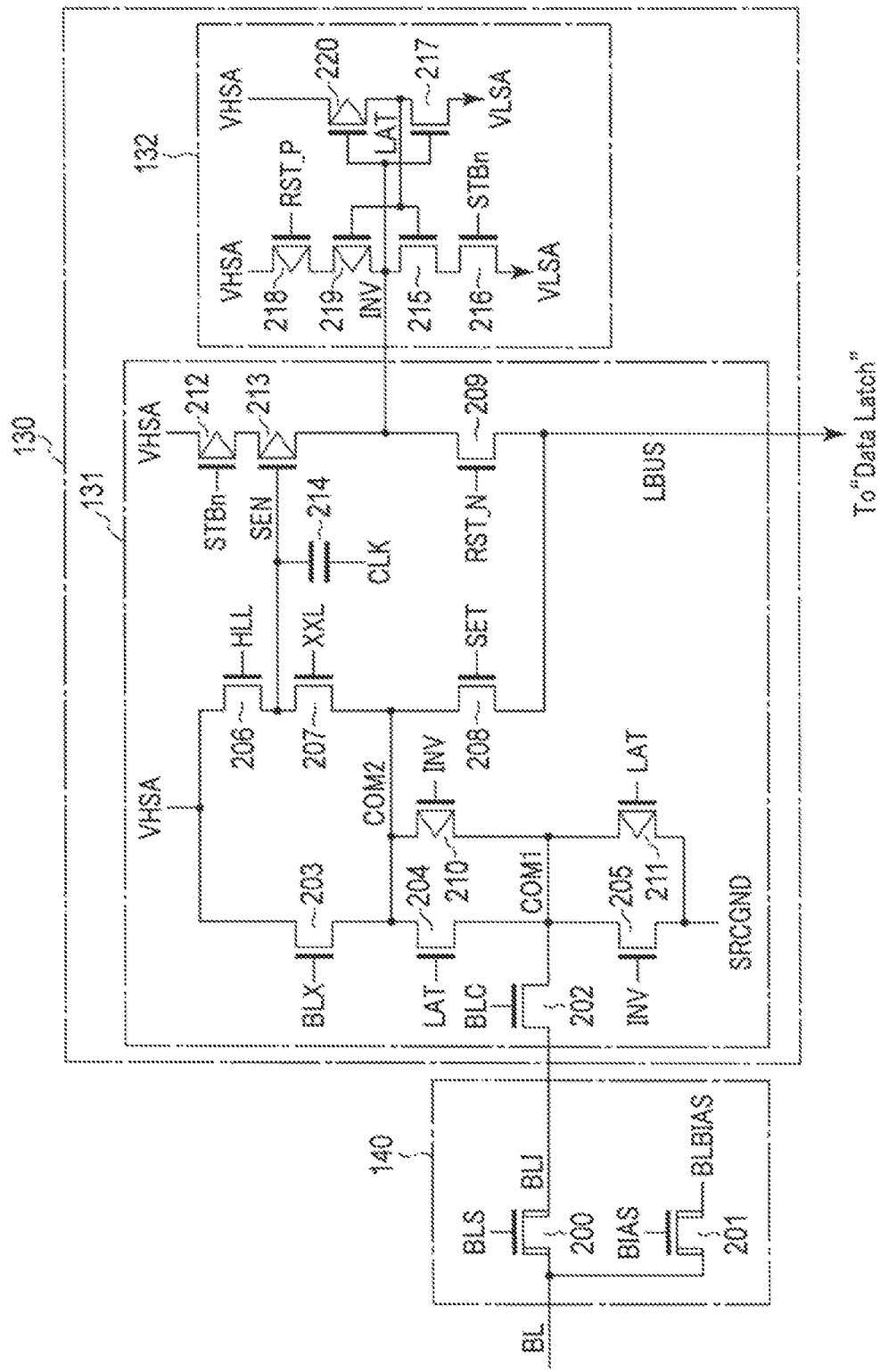
FIG. 4 is a circuit diagram illustrating a sense amplifier unit provided in the semiconductor memory device according to the first embodiment.

The sense amplifier 113 according to this embodiment includes for each bit line a sense amplifier unit 130 and a hookup section 140 which are illustrated in FIG. 4. The sense amplifier unit 130 includes a sense amplifier section 131 and a latch circuit 132.

The sense amplifier section 131 senses the data read in the bit line BL at the time of performing a reading operation with respect to the data, and temporarily holds the data in the latch circuit 132. In addition, the sense amplifier section 131 temporarily holds write data received from the outside in the latch circuit 132 at the time of performing a writing operation with respect to the data, and applies a voltage according to the write data to the bit line BL. Furthermore, the number of latch circuits 132 is not limited to one, and for example, when multi-valued data or the like is processed, a plurality of latch circuits 132 may be arranged.

The hookup section 140 is arranged between the sense amplifier unit 130 and the bit line BL. The hookup section 140 connects the bit line BL to the sense amplifier unit 130 at the time of writing and reading the data, and transmits a high voltage necessary for the erasing to the bit line BL from the driver 123 at the time of erasing the data.

Next, the circuit configuration of the sense amplifier unit 130 and the hookup section 140 will be described.

As illustrated in FIG. 4, the sense amplifier section 131 includes low breakdown voltage n channel MOS transistors 202 to 209, low breakdown voltage p channel MOS transistors 210 to 213, and a capacitor element 214.

In the transistor 202, a signal BLC is input to a gate, any one of a source and a drain is connected to a node BLI, and the other one is connected to a node COM1. The transistor 202 clamps the corresponding bit line BL to a potential according to the signal BLC.

In the transistor 203, a signal BLX is input to a gate, any one of a source and a drain is connected to a node VHSA, and the other one is connected to a node COM2. The node VHSA, for example, is connected to the driver 123, and for example, a voltage VDDSA is transmitted therethrough.

In the transistor 204, a node LAT is connected to a gate, any one of a source and a drain is connected to the node COM2, and the other one is connected to the node COM1. In the transistor 210, a node INV is connected to a gate, any one of a source and a drain is connected to the node COM2, and the other one is connected to the node COM1. The transistors 204 and 210 forma first switch which switches On and Off according to the data held in the latch circuit 132.

In the transistor 205, the node INV is connected to a gate, any one of a source and a drain is connected to the node COM1, and the other one is connected to a node SRCGND. The node SRCGND, for example is connected to the driver 123, and for example, and a ground potential VSS is transmitted therethrough. In the transistor 211, a node LAT is connected to a gate, any one of a source and a drain is connected to the node COM1, and the other one is connected to the node SRCGND. The transistors 205 and 211 forma second switch which switches On and Off according to the data held in the latch circuit 132.

In the transistor 206, a signal HLL is input to a gate, any one of a source and a drain is connected to the node VHSA, and the other one is connected to a node SEN. In the transistor 207, a signal XXL is input to a gate, any one of a source and a drain is connected to the node SEN, and the other one is connected to the node COM2. In the capacitor element 214, one electrode is connected to the node SEN, and a clock signal CLK in input to the other electrode. In the transistor 208, a signal SET is input to a gate, any one of a source and a drain is connected to the node COM2, and the other one is connected to a bus LBUS. In the transistor 212, a signal STBn is input to a gate, any one of a source and a drain is connected to the node VHSA, and the other one is connected to any one of a source and a drain of the transistor 213. In the transistor 213, the node SEN is connected to a gate, and the other one of the source and the drain is connected to the node INV. In the transistor 209, a signal RST_N is input to a gate, any one of a source and a drain is connected to the node INV, and the other one is connected to the bus LBUS.

Next, the latch circuit 132 will be described. The latch circuit 132 includes low breakdown voltage n channel MOS transistors 215 to 217 and low breakdown voltage p channel MOS transistors 218 to 220.

In the transistor 218, a signal RST_P is input to a gate, any one of a source and a drain is connected to the node VHSA, and the other one is connected to any one of a source and a drain of the transistor 219. In the transistor 219, the node LAT is connected to a gate, and the other one of the source and the drain is connected to the node INV. In the transistor 215, the node LAT is connected to a gate, any one of a source and a drain is connected to the node INV, and the other one is connected to anyone of a source and a drain of the transistor 216. In the transistor 216, a signal STBn is input to a gate, and the other one of the source and the drain is connected to the node VLSA. The node VLSA, for example, is connected to the driver 123, and for example, the ground potential VSS is transmitted therethrough. In the transistor 220, the node INV is connected to a gate, any one of a source and a drain is connected to the node VHSA, and the other one is connected to the node LAT. In the transistor 217, the node INV is connected to a gate, any one of a source and a drain is connected to the node LAT, and the other one is connected to the node VLSA.

In the latch circuit 132, a first inverter includes the transistors 215 and 219, and a second inverter includes the transistors 217 and 220. Thus, the node INV is connected to an output of the first inverter and an input of the second inverter, and the node LAT is connected to an input of the first inverter and an output of the second inverter. Accordingly, the latch circuit 132 holds the data in the node LAT, and holds inverted data thereof in the node INV.

Next, the hookup section 140 will be described. The hookup section 140 includes high breakdown voltage n channel MOS transistors 200 and 201. The transistors 200 and 201 are each a transistor having resistance higher than that of the transistors 202 to 213 and 215 to 220 described above, and are designed to apply a voltage higher than these transistors. Specifically, in comparison between the high breakdown voltage transistor and the low breakdown voltage transistor, for example, the high breakdown voltage transistor has a thick gate oxide film and a large transistor size.

In the transistor 200, a signal BLS is input to a gate, anyone of a source and a drain is connected to the corresponding bit line BL, and the other one is connected to the sense amplifier section 131 through the node BLI. In the transistor 201, a signal BIAS is input to a gate, any one of a source and a drain is connected to the corresponding bit line BL, and the other one is connected to a node BLBIAS. The node BLBIAS, for example, is connected to the driver 123, and for example, transmits a high voltage applied to the bit line BL at the time of erasing the data. Accordingly, the hookup section 140 sets the transistor 200 to be in an on state and the transistor 201 to be in an off state at the time of connecting the bit line BL to the sense amplifier unit 130. In addition, the hookup section 140 sets the transistor 200 to be in the off state and the transistor 201 to be in the on state at the time of applying a high voltage to the bit line BL, and thus electrically connects the bit line BL to the node BLBIAS and transmits the high voltage to the bit line BL.

1.2 Data Erasing Operation

Next, a data erasing operation according to this embodiment will be described in detail particularly based on a voltage of various lines and a voltage increase due to a capacitance coupling.

1.2.1 Voltage in Erasing

Figure 5:
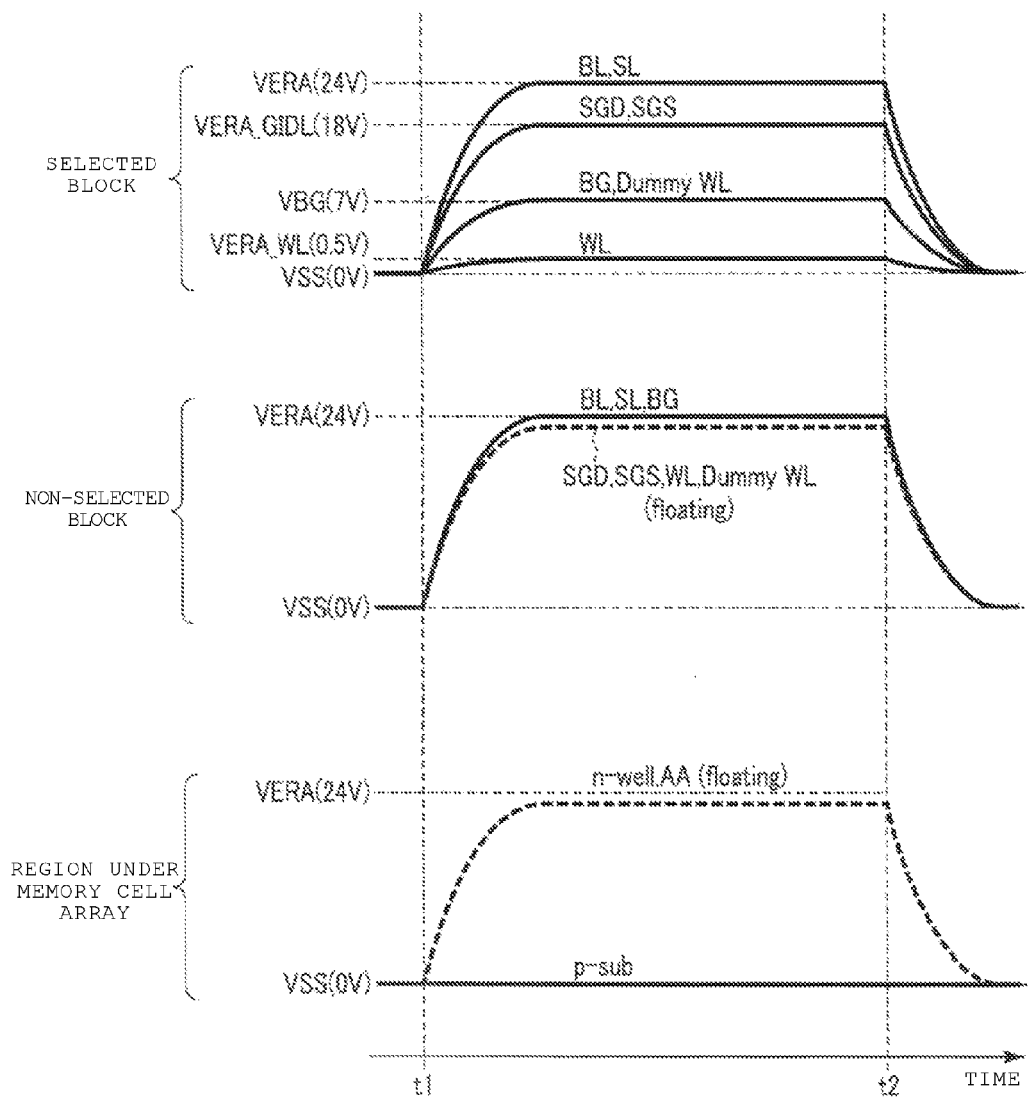
FIG. 5 is a timing diagram illustrating a potential of various lines at the time of erasing of the semiconductor memory device according to the first embodiment.

First, a potential relationship of various lines at the time of erasing the data will be described with reference to FIG. 5.

As illustrated, the sense amplifier 113 applies a voltage VERA (for example, 24V) to the bit line BL. More specifically, in the hookup section 140, the voltage VERA supplied to the node BLBIAS by the driver 123 is transmitted to the bit line BL through the transistor 201. The voltage VERA is a high voltage for generating a gate induced drain leakage (GIDL) by the select transistors ST1 and ST2 at the time of the erasing. Similarly, the driver 123 applies VERA to the source line SL. Then, the row decoder 112 applies a voltage VERA_GIDL (for example, 18 V) to the select gate lines SGD and SGS of the selected block BLK. The voltage VERA_GIDL is a high voltage for generating GIDL, and is in a relationship of VERA>VERA_GIDL.

In this state, the row decoder 112 applies a voltage VBG (for example, 7 V) to the back gate line BG of the selected block BLK. The voltage VBG is a voltage at which the back gate transistor BT is able to be in the on state and a hole generated by GIDL is able to be transmitted, and is a voltage at which the hole generated by GIDL is not injected into a charge storage layer of the back gate transistor BT. Similarly, the row decoder 112 applies VBG to the dummy word line WL_D and sets the dummy memory cell transistor MT_D to be in the on state. Then, the row decoder 112 applies a voltage VERA_WL (for example, 0.5 V) to the word lines WL0 to WL7. VERA_WL is a voltage which is sufficiently lower than VERA such that the hole generated by GIDL is injected into the charge storage layer of the memory cell transistor MT. Accordingly, the hole generated by GIDL is supplied to the charge storage layer of the memory cell transistors MT0 to MT7 connected to the word lines WL0 to WL7, and thus the data is erased.

In addition, in the non-selected block BLK, the row decoder 112 applies VERA (for example, 24 V) to the back gate line BG and sets the back gate transistor BT to be in the off state. At this time, in the back gate transistor BT, GIDL is not generated. Then, the word line (including the dummy word line) and the select gate lines SGD and SGS are in a floating state. According to this, the potential of the word line WL and the select gate lines SGD and SGS, for example, increases to approximately VERA due to a capacitance coupling with respect to the bit line BL, the source line SL, and the back gate line BG.

In addition, the driver 123 electrically blocks the voltage generating circuit 122 from the wiring connected to the n type well 21 and the element region 23 and sets the n type well 21, the element region 23, and the wiring connected thereto to be in an electrically floating state. As a result thereof, the potential of the n type well 21 and the element region 23, for example, is higher than the power-supply voltage VDD and increases to approximately VERA due to a capacitance coupling with respect to the bit line BL, the source line SL, and the back gate line BG of the non-selected block BLK to which VERA is applied. Furthermore, the potential of the n type well 21 and the element region 23 may be less than or equal to the power-supply voltage VDD, or may increase due to the capacitance coupling.

1.2.2 Specific Example of Voltage in Erasing

Figure 6:
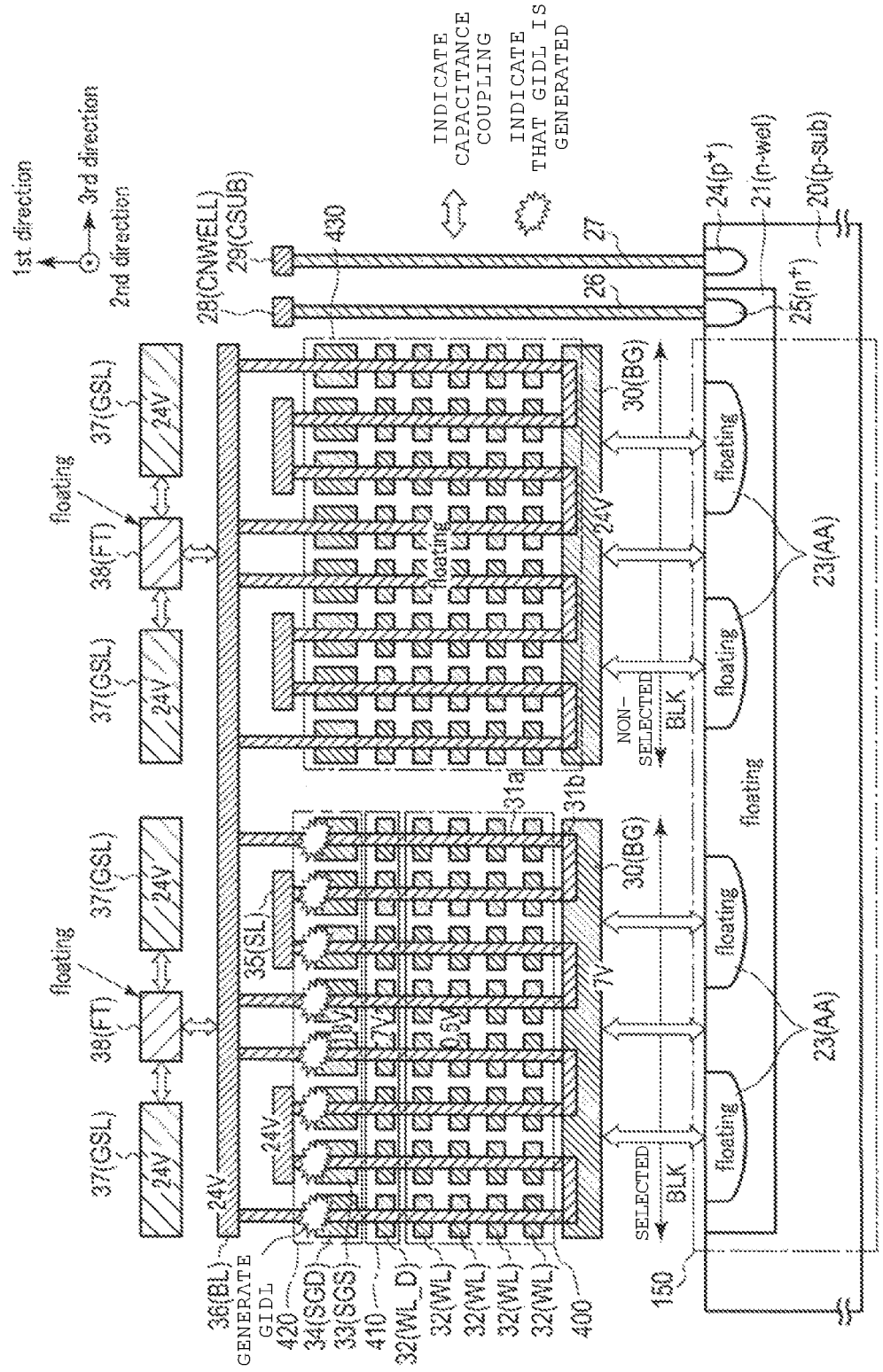
FIG. 6 is a sectional view of the memory cell array and the semiconductor substrate illustrating a capacitance coupling at the time of the erasing of the semiconductor memory device according to the first embodiment.

Next, a specific example of a voltage of various lines at the time of the erasing the data will be described with reference to FIG. 6 particularly based on a capacitance coupling relevant to the n type well 21 and the element region 23.

As illustrated, in the selected block BLK, a region 420 indicates the select transistors ST1 and ST2 which generate GIDL. A region 410 indicates the dummy memory cell transistor MT_D, and a region 400 indicates the memory cell transistors MT, each of which is an erasing target.

In the non-selected block BLK, a region 430 indicates a region which is in the floating state, and the select gate lines SGD and SGS, the dummy word line WL_D, and the word line WL are in the floating state.

In the region 150, the n type well 21 and the element region 23 are in the floating state, and VSS (for example, 0 V) is applied to the semiconductor substrate 20.

In the upper portion of the memory cell array 111, the transmission line FT connected to the n type well 21 or the element region 23 is in the floating state.

In this state, in the region 150, the n type well 21 and the element region 23 are affected by a capacitance coupling with respect to the back gate line BG. In this case, the voltage of the back gate line BG of the non-selected block BLK is higher than the voltage of the back gate line BG of the selected block BLK, and thus the back gate line BG of the non-selected block BLK causes an increase in the potential of the n type well 21 and the element region 23 due to capacitance coupling. In addition, in the upper portion of the memory cell array 111, the transmission line FT is affected by a capacitance coupling with respect to the adjacent global source line GSL, the bit line BL positioned in the lower portion, and the source line SL. Accordingly, the potential of the n type well 21 and the element region 23 increases due to the capacitance coupling with the back gate line BG, the global source line GSL, the bit line BL, and the source line SL.

1.3 Effect of this Embodiment

According to the configuration of this embodiment, it is possible to reduce the power consumption. This effect will be described as follows.

In the data erasing operation, for example, VERA is applied to the bit line BL, the source line SL (and the global source line GSL), and the back gate line BG of the non-selected block BLK. At this time, in the upper portion of the memory cell array 111, there is parasitic capacitance between the bit line BL and the source line SL, and the transmission line FT. In addition, in the lower portion of the memory cell array 111, there is parasitic capacitance between the back gate line BG of the non-selected block BLK, and the element region 23 or the n type well 21. For this reason, in order to apply VERA to the bit line BL, the source line SL, and the back gate line BG of the non-selected block BLK, it is necessary to perform charging by the amount of this parasitic capacitance, and thus the current consumption in the erasing operation increases, and the power consumption of the semiconductor memory device increases.

In contrast, in the configuration according to this embodiment, the element region 23, the n type well 21, and the transmission line FT connected thereto are in the floating state. As a result, the potential of the element region 23, the n type well 21, and the transmission line FT, for example, is higher than the power-supply voltage VDD due to the capacitance coupling with respect to the bit line SL, the source line SL, and the back gate line BG of the non-selected block BLK to which VERA is applied, and increases to approximately VERA (furthermore, may be less than or equal to VDD, or may increase to be greater than or equal to 0 V). Accordingly, it is possible to decrease a potential difference between the potential of the bit line SL, the source line SL, and the back gate line BG of the non-selected block BLK and the potential of the element region 23, the n type well 21, and the transmission line FT. Accordingly, it is possible to reduce an amount of charging as result of parasitic capacitance. Accordingly, it is possible to reduce the current consumption at the time of performing the erasing operation, and it is possible to reduce the power consumption of the semiconductor memory device.

In addition, in this embodiment, the potential of the n type well 21 increases due to the capacitance coupling, and thus is higher than the potential of the semiconductor substrate 20 (for example, VSS). Accordingly, a reverse bias is applied between the n type well 21 and the semiconductor substrate 20, and thus it is possible to suppress the movement of the charge to the p type semiconductor substrate from the n type well 21.

Furthermore, the element region 23 may be formed in a p type well which is arranged in the surface region of the n type well 21, and in this case, the element region 23, the p type well, and the n type well 21 are in the floating state.

Further, in this embodiment, the n type well 21 is in the floating state, and VERA may be applied to the n type well 21. In addition, when the p type well is arranged in the surface region of the n type well 21, VERA may be applied to the p type well and the n type well 21.

Further, VERA may be applied to the element region 23.

Further, the n type well 21 arranged in the region 150 may be divided into a plurality of n type wells.

Further, the element region 23 may be a dummy element region 23.

2. Second Embodiment

Next, a semiconductor memory device according to a second embodiment will be described. In this embodiment, the sense amplifier 113 is arranged in the lower portion of the memory cell array 111. Hereinafter, only differences from the first embodiment will be described.

2.1 Configuration of Sense Amplifier

Figure 7:
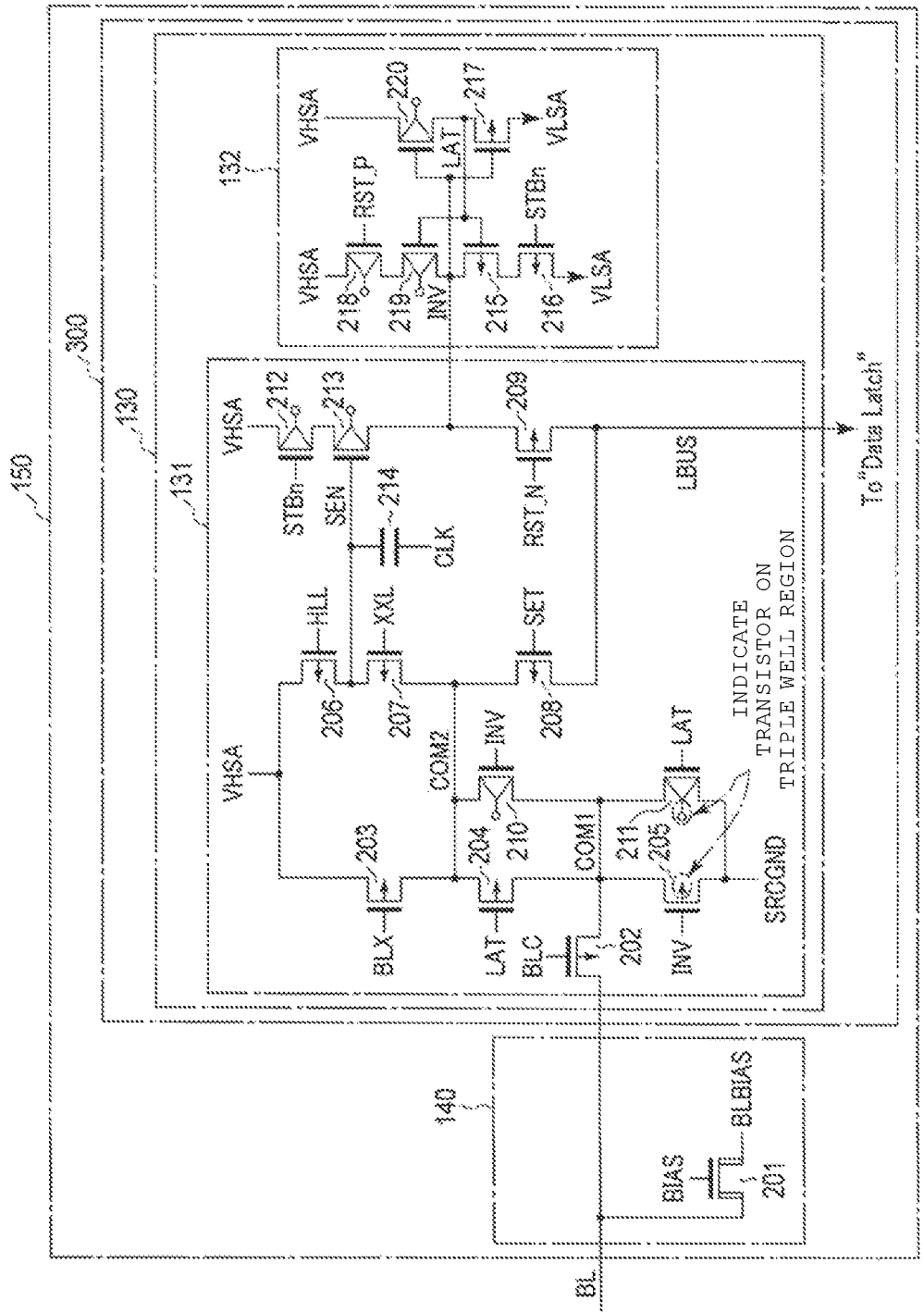
FIG. 7 is a circuit diagram illustrating a sense amplifier unit provided in a semiconductor memory device according to a second embodiment.

First, the configuration of the sense amplifier 113 will be described with reference to FIG. 7.

As illustrated, in the sense amplifier unit 130 of this embodiment, the low breakdown voltage n channel MOS transistors 202 to 209 and 215 to 217, the low breakdown voltage p channel MOS transistors 210 to 213 and 218 to 219 are formed on a triple well region 300. Hereinafter, herein, the region of the n type well 21 including a p type well (a triple well is formed by the p type semiconductor substrate 20, the n type well 21, and the p type well) in a part of the surface region is defined as a "triple well region".

In addition, in the hookup section 140, the high breakdown voltage n channel MOS transistor 200 which is arranged in the first embodiment is omitted, and any one of the source and the drain of the transistor 202 is connected to the bit line BL, not through the high breakdown voltage n channel MOS transistor.

2.2 Configuration of Driver

Next, the configuration of the driver 123 will be described with respect to FIG. 8. In this embodiment, the driver 123 includes the high breakdown voltage n channel MOS transistor in order to control a voltage and a signal which are supplied to the source line SL, the sense amplifier 113, and the semiconductor substrate 20 from the voltage generating circuit 122. In addition, in this embodiment, a case in which the peripheral circuit 120 is arranged in the vicinity of the memory cell array will be described as an example.

As illustrated, the driver 123 includes high breakdown voltage n channel MOS transistors 260 to 278.

In the transistors 260 to 262, any one of a source and a drain is connected to the source line SL. Then, in the transistor 260, a signal SL_SWH is input to a gate, and VDDSA is applied to the other one of the source and the drain. In the transistor 261, a signal SL_SWL is input to a gate, and VSS is applied to the other one of the source and the drain. In the transistor 262, a signal VERA_SW is input to a gate, and VERA is applied to the other one of the source and the drain. That is, the transistors 260 to 262 are connected in common to the source line SL, and when any one of the signals SL_SWH, SL_SWL, and VERA_SW is in a "H" state, transmit VDDSA, VSS, or VERA to the source line SL according to the signal.

In the transistor 263, a signal VDDSA_SW is input to a gate, any one of a source and a drain is connected to the node VHSA, and VDDSA is applied to the other one. In the transistor 264, a signal VSSSA_SW is input to a gate, any one of a source and a drain is connected to the node VLSA, and VSS is applied to the other one. In the transistor 265, a signal BLBIAS_SW is input to a gate, any one of a source and a drain is connected to the node BLBIAS, and VERA is applied to the other one.

In the transistor 266, any one of a source and a drain is connected to the gate of the transistor 201 of the hookup section 140, and the transistor 266 is used for controlling the signal BIAS which is transmitted to the transistor 201.

In the transistor 267, any one of a source and a drain is connected to the node SRCGND of each of the sense amplifier unit 130 (a reference numeral of SAU in FIG. 9), and the transistor 267 is used for controlling the voltage which is transmitted to the node SRCGND.

In the transistors 268 to 275, any one of a source and a drain is connected to each of the sense amplifier units 130. Then, the transistors 268 to 275 are used for controlling the signals BLC, BLX, HLL, XXL, SET, RST_N, RST_P, STBn. In the transistor 276, any one of a source and a drain is connected to the electrode of the capacitor element 214 in each of the sense amplifier units 130, and the transistor 276 is used for controlling the clock signal CLK.

In the transistor 277, any one of a source and a drain is connected to the n type well which is arranged in the triple well region 300. In addition, in the transistor 278, any one of a source and a drain is connected to the p type well which is arranged in the triple well region 300. Then, the transistors 277 and 278 are used for controlling the voltage of the n type well and the p type well in the triple well region 300.

Figure 9:
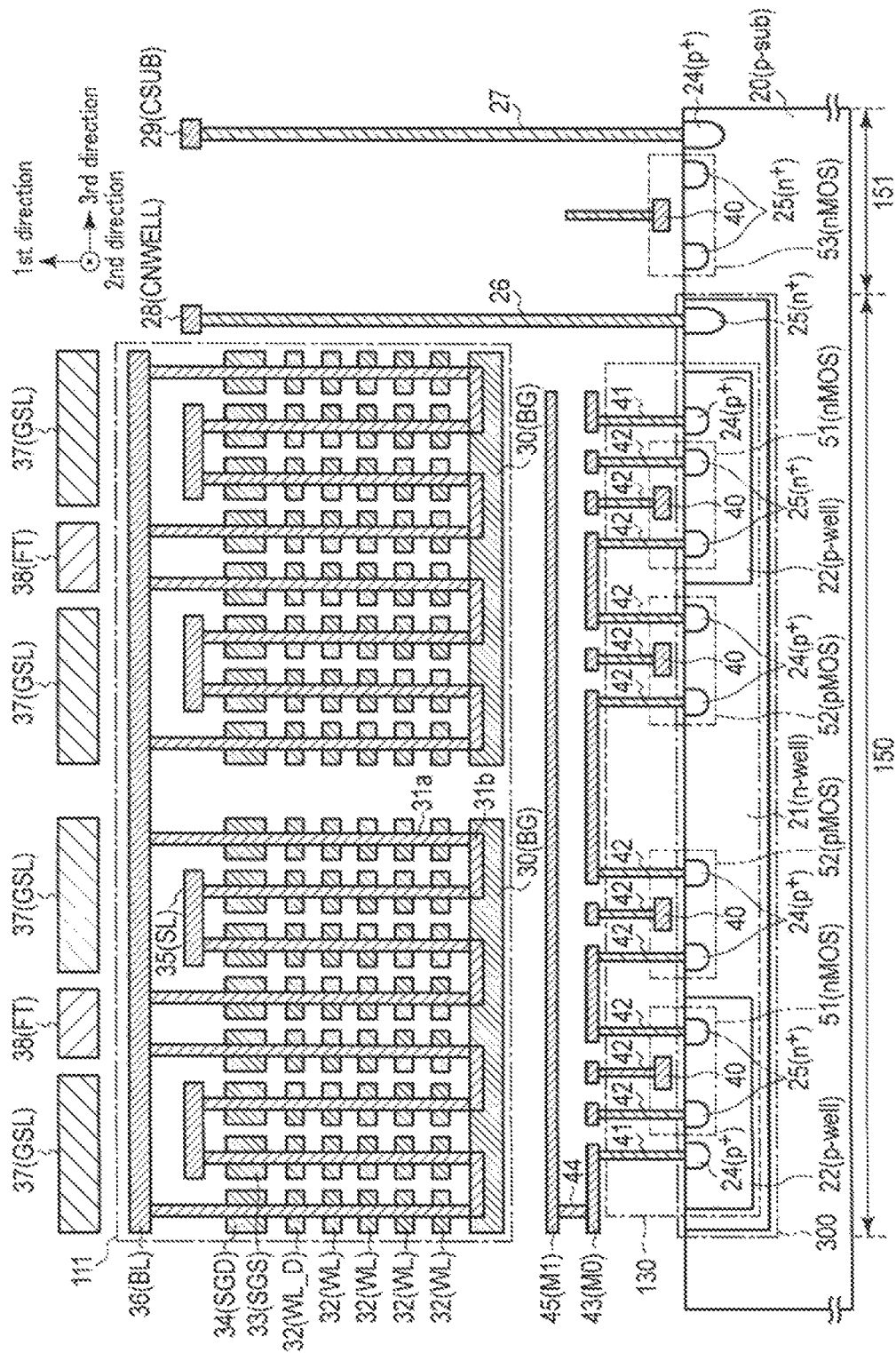
FIG. 9 is a sectional view of a memory cell array and a semiconductor substrate provided in the semiconductor memory device according to the second embodiment.

2.3 Sectional Configuration of Memory Cell Array and Semiconductor Substrate Next, the sectional configuration of the memory cell array 111 and the semiconductor substrate according to this embodiment will be described with reference to FIG. 9.

As illustrated, the triple well region 300 is arranged in the surface region of the semiconductor substrate 20 in the region 150, and the triple well region 300 includes the n type well 21 and the p type well 22.

A low breakdown voltage p channel MOS transistor 52 is formed in the n type well 21, and a low breakdown voltage n channel MOS transistor 51 is formed in the p type well 22. These transistors 51 and 52 are used in the sense amplifier unit 130. The transistor 51 includes the $n^+$ diffusion layer 25 and a gate electrode 40. The transistor 52 includes the $p^+$ diffusion layer 24 and the gate electrode 40. Then, the source, the drain, and the gate electrode 40 of the transistor 51 and the transistor 52 are respectively connected to a wiring layer 43 through contact plugs 42. In addition, the $p^+$ diffusion layer 24 is formed in the p type well 22, and is connected to the wiring layer 43 through the contact plug 41. Then, the wiring layer 43 is connected to a wiring layer 45 through a contact plug 44. Hereinafter, in this embodiment, the wiring layer 43 is referred to as "M0 wiring", and the wiring layer 45 is referred to as "M1 wiring". The M1 wiring is positioned in the upper portion of the semiconductor substrate relative to the M0 wiring. The M0 wiring and the M1 wiring are used for connecting the transistors formed in the region 150. For example, the M0 wiring and the M1 wiring are used for connecting the transistors in the sense amplifier unit 130, or for supplying a voltage to the sense amplifier unit 130 and for transmitting and receiving a signal or the like, and for example, are connected to the transmission line FT by a contact plug (not illustrated). Furthermore, in this embodiment, the wiring layer has a two-layer structure of the M0 wiring and the M1 wiring, but may have a structure only including the M0 wiring, or may have a wiring structure of three or more layers. Further, in the region 150, the high breakdown voltage transistor may be formed in a region other than the triple well region 300.

In addition, in a region 151 in the vicinity of the memory cell array 111, for example, an n channel MOS transistor 53 is formed in a region in which a well is not formed.

Furthermore, a triple well region for a high breakdown voltage transistor may be arranged in both the region 150 and the region 151, and the high breakdown voltage transistor may be arranged therein. In this case, the triple well region for a high breakdown voltage transistor is a different well region separated from the triple well region in which the low breakdown voltage transistor is formed.

Further, the triple well region may be arranged in the region 151, and the low breakdown voltage transistor may be arranged therein.

2.4 Data Erasing Operation

Figure 11:
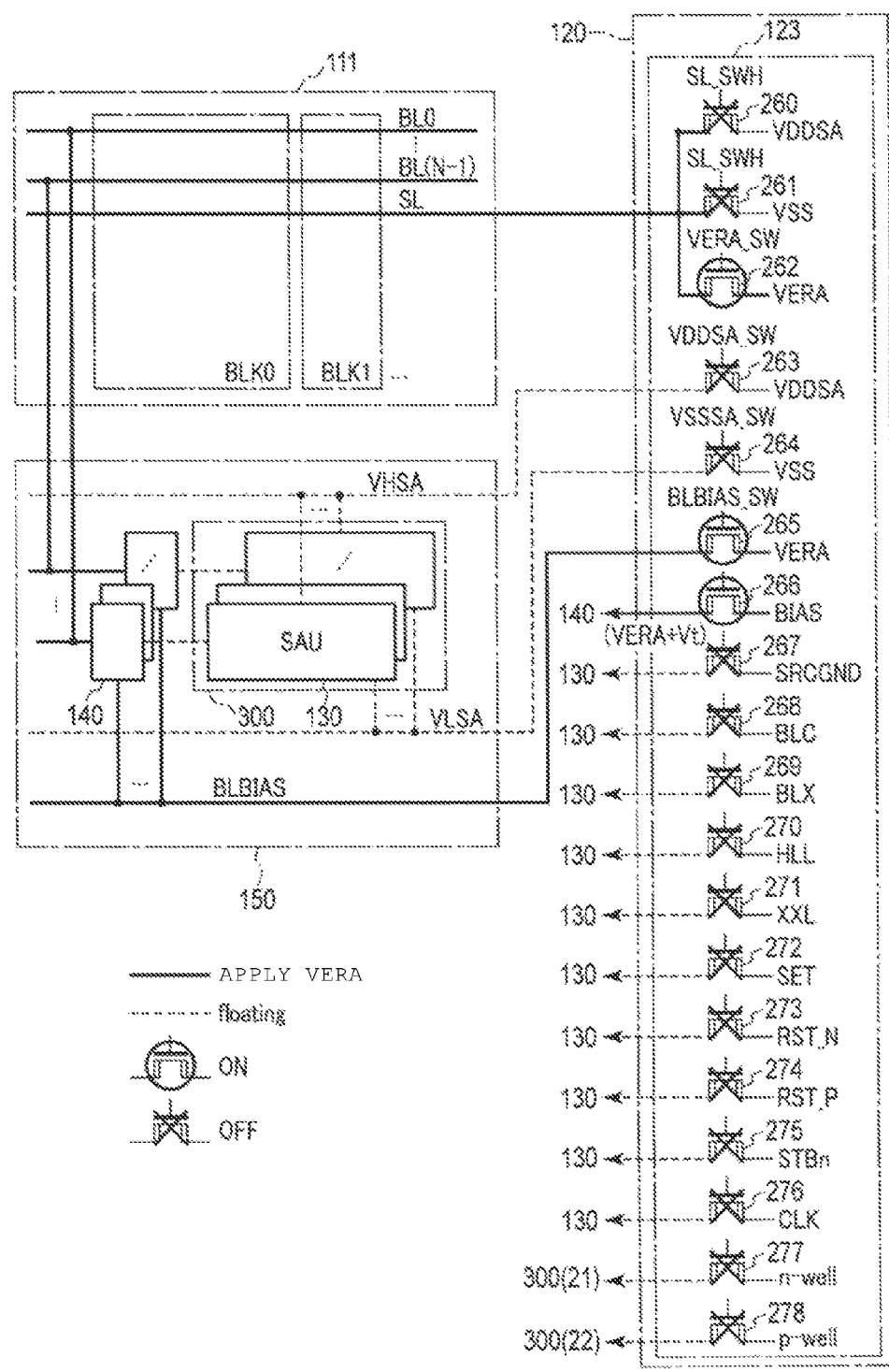
FIG. 11 is a block diagram illustrating a connection of the driver at the time of the erasing of the semiconductor memory device according to the second embodiment.
Figure 12:
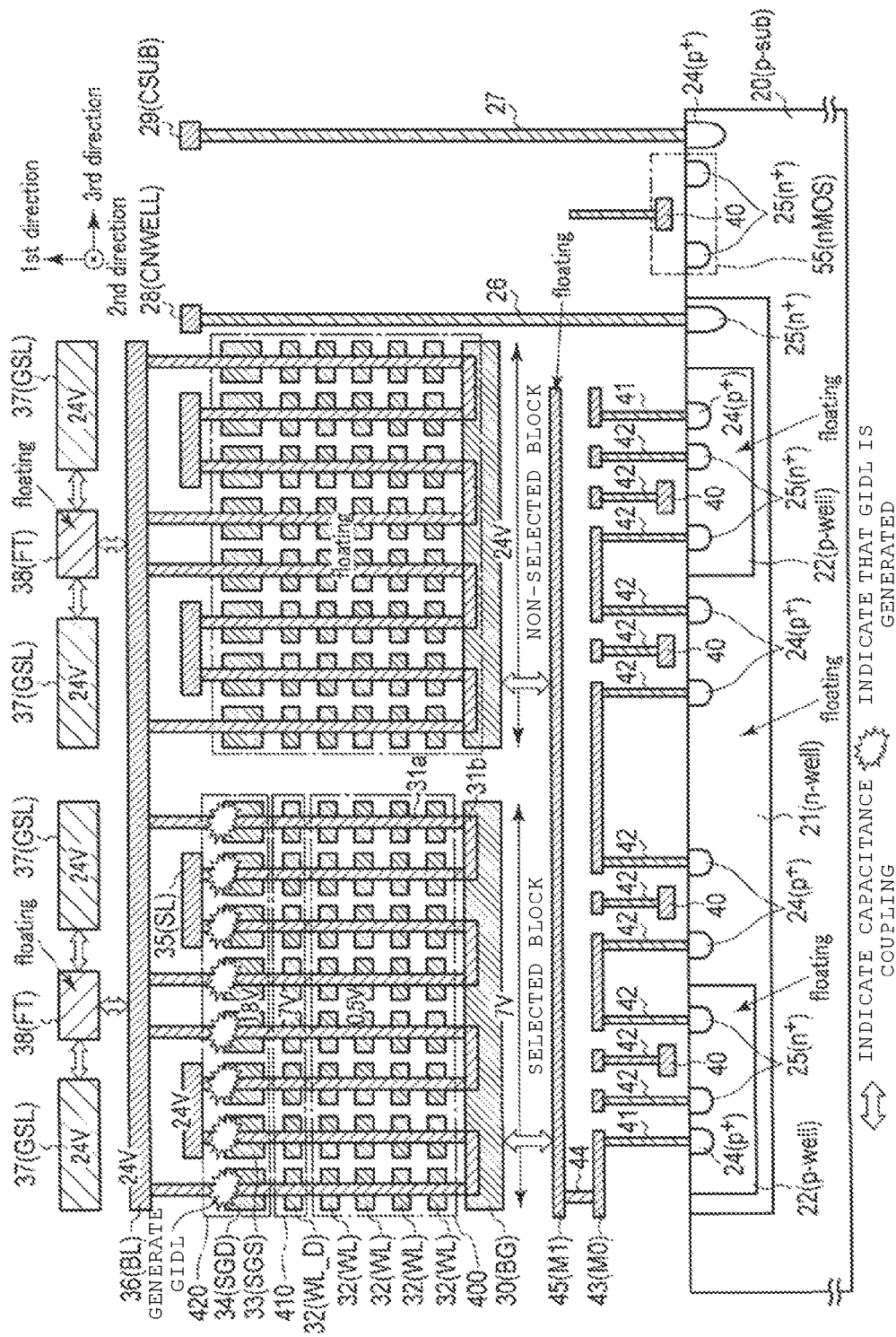
FIG. 12 is a sectional view of the memory cell array and the semiconductor substrate illustrating a capacitance coupling at the time of the erasing of the semiconductor memory device according to the second embodiment.

Next, the data erasing operation according to this embodiment will be described with reference to FIG. 10 to FIG. 12 particularly based on a voltage of each wiring and a voltage increase due to a capacitance coupling. Hereinafter, when the node VHSA, the node VLSA, and the node SRCGND which are connected to the sense amplifier unit 130 are not distinguished from each other, these nodes are simply referred to as a "power-supply line".

First, the voltage of each of various conductive lines will be described with reference to FIG. 10. Furthermore, the potential of the selected block BLK and the non-selected block BLK of the memory cell array 111 at a time t1 is identical to that in the first embodiment illustrated in FIG. 5. Hereinafter, only differences from the first embodiment will be described.

As illustrated, at a time t0, the driver 123 sets the voltage of the signal BIAS to VSS and the transistor 201 of the hookup section 140 to be in the off state. In addition, the driver 123 applies VSS to the node BLBIAS, the node VLSA, and the node SRCGND, and applies VDDSA to the node VHSA. Further, the driver 123 sets the voltage of the clock signal CLK as VSS.

In this state, the driver 123 sets the voltage of the signal RST_P to VSS from VDDSA and the transistor 218 of the sense amplifier unit 130 to be in the on state. Accordingly, a node connecting the transistors 218 and 219 is charged to VDDSA. After that, the driver 123 sets the voltage of the signal RST_P as VDDSA again and the transistor 218 to be in the off state. After that, the driver 123 sets the potential of the signals BLC, BLX, XXL, HLL, SET, RST_N, and STBn to VDDSA from VSS. Accordingly, the transistors 202, 203, 206 to 209, and 216 corresponding to the respective signals are in the on state, and the node SEN, the node COM2, the node INV, and the bus LBUS are charged to VDDSA-Vt (Vt is a threshold value of the n channel MOS transistor). On the other hand, the potentials of the node LAT, the node SRCGND, the node COM1, and the bit line BL are set as VSS. In addition, the p channel MOS transistor 212 to which the signal STBn is input is in the off state from the on state. At this time, a node connecting the transistors 212 and 213 is charged to VDDSA. Thus, in the sense amplifier section 131 and the latch circuit 132, the n channel MOS transistors 204 and 215 are in the off state, and the other n channel MOS transistors 202, 203, 205 to 209, 216, and 217 are in the on state. In addition, the p channel MOS transistors 211 and 219 are in the on state, and the other p channel MOS transistors 210, 212, 213, 218, and 220 are in the off state.

Next, the voltage of the wiring at the time t1 will be further described with reference to FIG. 11 and FIG. 12.

Figure 10:
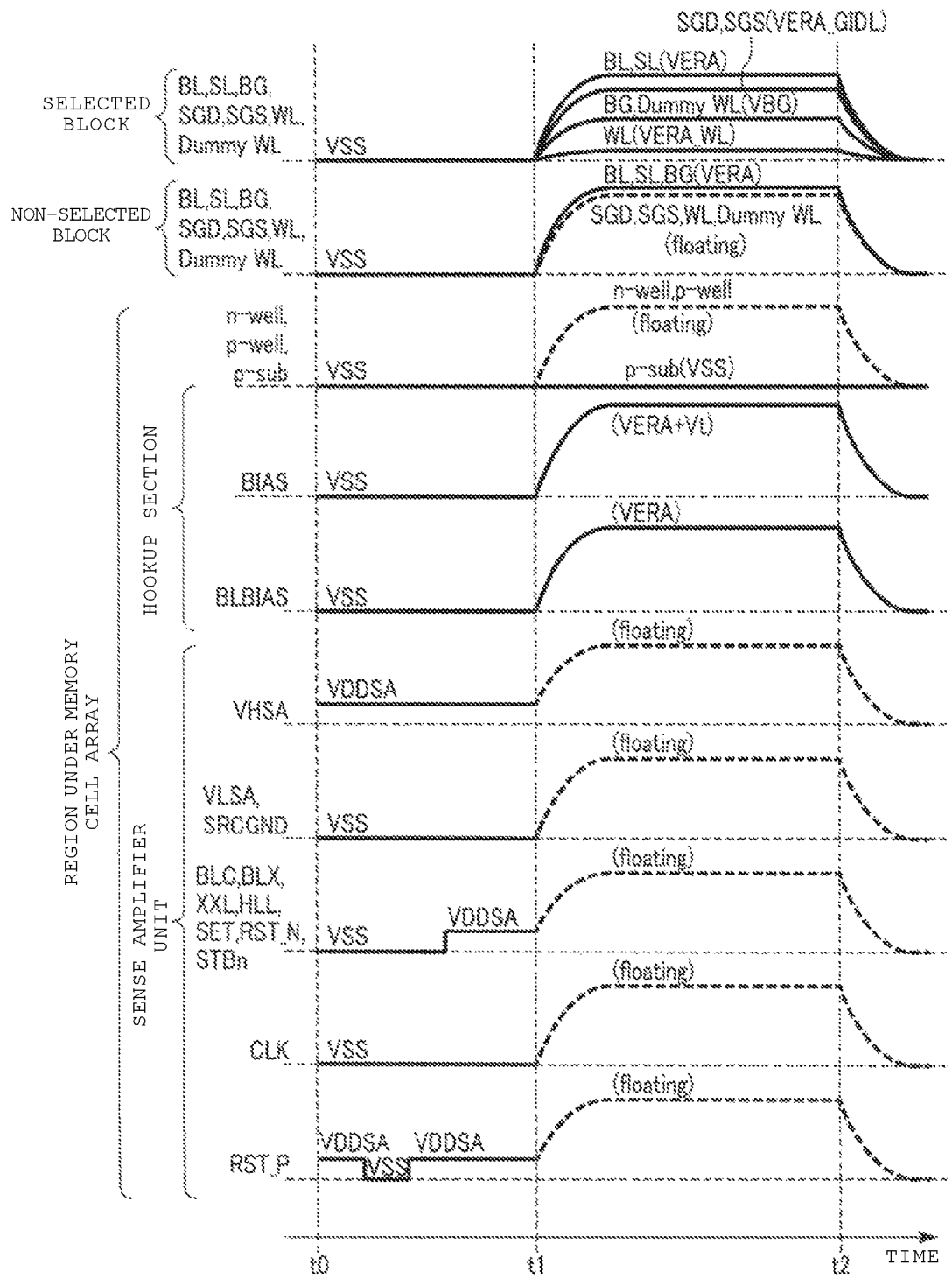
FIG. 10 is a timing diagram illustrating a potential of various lines at the time of erasing of the semiconductor memory device according to the second embodiment.

As illustrated in FIG. 10, each power-supply line (the node VHSA, the node VLSA, and the node SRCGND) and each signal line (BLC, BLX, HLL, XLL, SET, RST_N, RST_P, STBn, and CLK) which are connected to the n type well 21, the p type well 22, and the sense amplifier unit 130 are in the floating state. Specifically, as illustrated in FIG. 11, the sequencer 121 sets the transistors 263, 264, and 267 to 278 to be in the off state in the driver 123.

In addition, the sequencer 121 sets the transistors 260 and 261 to be in the off state and the transistor 262 to be in the on state, and thus applies VERA to the source line SL. In addition, the sequencer 121 sets the transistors 265 and 266 to be in the on state, and thus applies VERA to the node BLBIAS, and sets the voltage of the signal BIAS, for example, as VERA+Vt. As a result thereof, the hookup section 140 transmits VERA to the bit line BL from the node BLBIAS.

In this state, as illustrated in FIG. 10, the potential of each of the power-supply lines and each of the wirings which are connected to the n type well 21, the p type well 22, and the sense amplifier unit 130 is higher than the power-supply voltage VDD due to the capacitance coupling, and for example, increases to approximately VERA. At this time, the potential of each of the nodes (the node SEN, the node COM1, the node COM2, LAT, INV, and the like) in the sense amplifier unit 130 also increases.

Next, the capacitance coupling with respect to the sense amplifier unit 130 will be described in detail with reference to FIG. 7, FIG. 9, and FIG. 12. The transmission line FT, the M1 wiring, and the M0 wiring which are connected to the n type well 21 or the p type well 22 formed on the triple well region 300 are in the floating state. In addition, VERA is applied to the M1 wiring and the M0 wiring which connect a node between the hookup section 140 (not illustrated) and the bit line BL. VERA is also applied to the transmission line FT, the M1 wiring, and the M0 wiring which connects a node BLBIAS. In addition, VERA+Vt is applied to the transmission line FT, the M1 wiring, and the M0 wiring which connects a node BIAS.

In this state, the transmission line FT in the floating state is affected by the capacitance coupling with respect to the global source line GSL (that is source line SL) and the bit line BL to which VERA is applied. In addition, the M1 wiring in the floating state is affected by the capacitance coupling with respect to the back gate line BG. Further, the transmission line FT, the M1 wiring, and the M0 wiring in the floating state are affected by the capacitance coupling with respect to the transmission line FT, the M1 wiring, and the M0 wiring to which VERA or VERA+Vt is applied. Accordingly, the potential of the transmission line FT, the M1 wiring, and the M0 wiring increases due to the capacitance coupling, and the potential of each of the nodes in the sense amplifier unit 130, and the n type well 21 and the p type well 22 which are connected to the wiring also increases.

2.5 Effect of this Embodiment

According to the configuration of this embodiment, the same effect as that of the first embodiment described above is able to be obtained.

In addition, in the configuration according to this embodiment, even when the circuit is arranged on the lower portion of the memory cell array 111, it is possible to reduce the power consumption. This effect will be described as follows.

In the three-dimensionally layered NAND flash memory, a method is considered in which the sense amplifier 113 having a large area is arranged on the lower portion of the memory cell array 111, and thus a chip area decreases, and the manufacturing cost is reduced. When the sense amplifier 113 is arranged on the lower portion of the memory cell array 111, in the data erasing operation, there is parasitic capacitance between the source line SL and the bit line BL to both of which VERA is applied, and the transmission line FT. In addition, there is parasitic capacitance between the back gate line BG of the non-selected block BLK to which VERA is applied and the M1 wiring. For this reason, the current consumption tends to be increased compared to a case where the sense amplifier 113 is arranged in the vicinity of the memory cell array 111.

In contrast, in the configuration according to this embodiment, in the data erasing operation, the power-supply line and the signal line which are connected to the sense amplifier unit 130 are in the floating state. Then, the potential of the transmission line FT and the M1 wiring increases due to the capacitance coupling with respect to the source line SL, the bit line BL, and the back gate line BG of the non-selected block BLK. Accordingly, it is possible to decrease a potential difference between the source line SL, the bit line BL, and the back gate line BG of the non-selected block BLK, and the transmission line FT and the M1 wiring. Accordingly, it is possible to reduce a charge amount for performing the charging by the amount of parasitic capacitance. Accordingly, it is possible to reduce the current consumption at the time of performing the erasing operation, and it is possible to reduce the power consumption of the semiconductor memory device.

In addition, in the configuration according to this embodiment, some of the transistors used in the sense amplifier 113, namely transistors 52, 53, are formed on the triple well region 300, and thus it is possible to configure these transistors as the low breakdown voltage transistor. This effect will be described in detail.

In the data erasing operation, in the sense amplifier unit 130, the potential of the wiring which is connected to the gate, the source, and the drain of each of the transistors and the potential of the p type well 22 and the n type well 21 in which each of the transistors is formed increase due to the capacitance coupling. Accordingly, even when the potential of each of the wirings connected to the transistor increases due to the capacitance coupling, the potential of the substrate bias also increases, and thus it is possible to prevent a high voltage difference from occurring in the transistor. Accordingly, it is possible to configure the sense amplifier unit 130 as the low breakdown voltage transistor. Accordingly, the low breakdown voltage transistor is able to have an area smaller than that of the high breakdown voltage transistor, and thus it is possible to suppress an increase in the area of the sense amplifier 113. Accordingly, it is possible to suppress an increase in the chip area.

In addition, in the configuration according to this embodiment, in the data erasing operation, the potential of the sense amplifier unit 130 increases to approximately VERA due to the capacitance coupling. For this reason, when VERA is applied to the bit line BL, a high voltage difference is suppressed in the transistor 202 of the sense amplifier unit 130. Accordingly, in the hookup section 140, it is possible to omit the high breakdown voltage transistor which connects the bit line BL to the sense amplifier unit 130. Accordingly, it is possible to suppress an increase in the chip area.

Furthermore, in this embodiment, the node VHSA, the node VLSA, or the node SRCGND which transmits the power-supply to the sense amplifier unit 130 is in the floating state, but in other embodiments, VERA may be applied thereto. Further, VERA may be applied to each signal connected to the sense amplifier unit 130.

Further, the p type well 22 and the n type well 21 are in the floating state, but in other embodiments, VERA may be applied to the p type well 22 and the n type well 21.

Further, in other embodiments, the triple well region 300 of the region 150 on the lower portion of the memory cell array 111 may be divided into a plurality of triple well regions.

Further, in other embodiments, the transistor 201 of the hookup section 140 may be formed in a different triple well separated from the low breakdown voltage n channel MOS transistor.

3. Third Embodiment

Next, a semiconductor memory device according to a third embodiment will be described. In this embodiment, the node VHSA and the node VLSA which are connected to the sense amplifier unit 130 are connected to the source line SL in the second embodiment. Hereinafter, only differences from the second embodiment will be described.

3.1 Configuration of Driver

Figure 13:
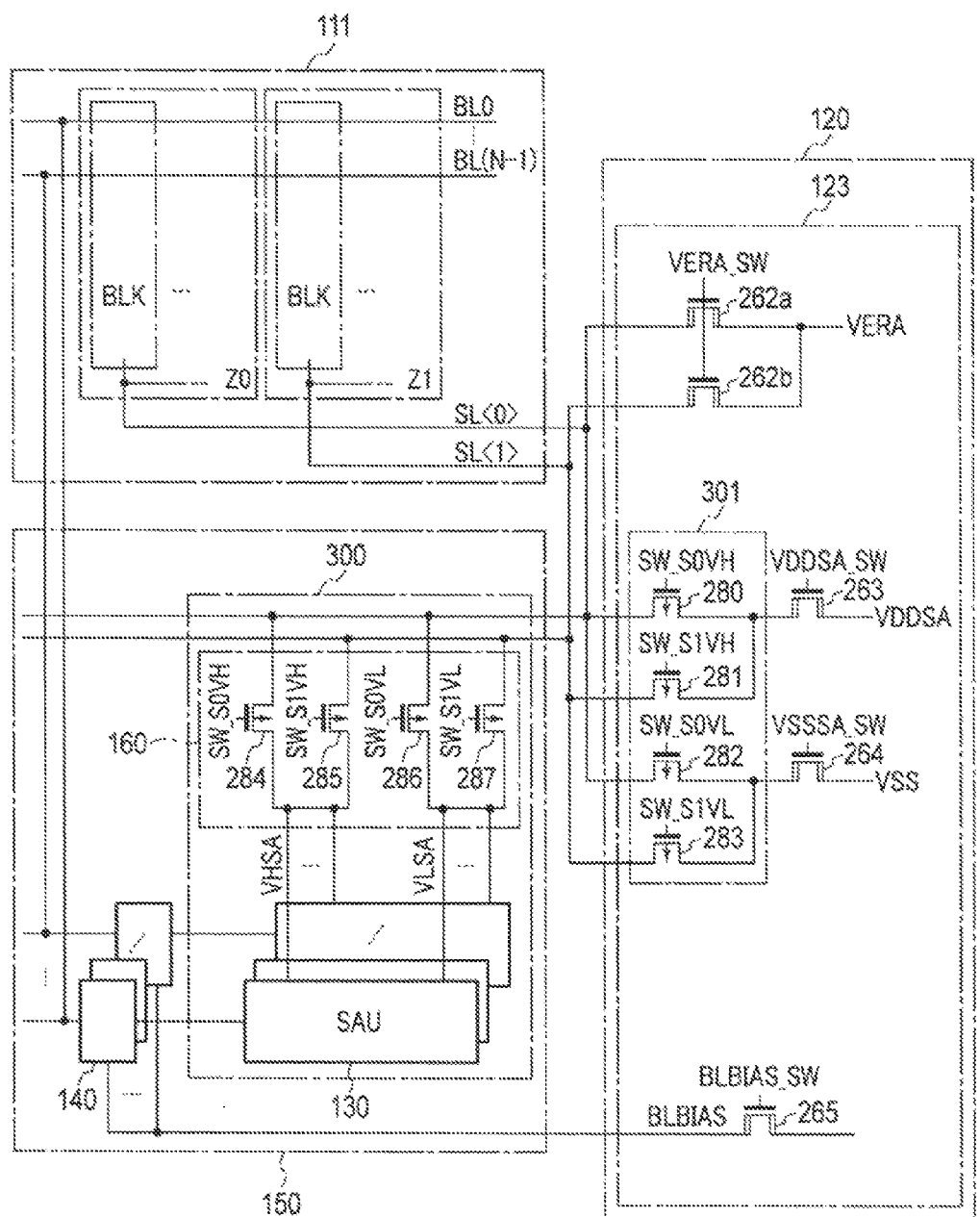
FIG. 13 is a block diagram illustrating a driver provided in a semiconductor memory device according to a third embodiment.

First, the configuration of the driver 123 according to this embodiment will be described with reference to FIG. 13 particularly based on a connection between the driver 123, and the source line SL and the power-supply line. In the configuration according to this embodiment, the memory cell array 111 is divided into two zones Z0 and Z1, and each of the zones includes at least one block BLK. Then, each of the zones Z0 and Z1 is connected to different source lines SL<0> and SL<1>. Furthermore, the number of zones is not limited to two, may be greater than or equal to three. Further, for example, each of the zones Z0 and Z1 may be connected to a source line SL which is different for each block BLK or for each string unit SU.

As illustrated, the driver 123 includes five high breakdown voltage n channel MOS transistors 262a, 262b, and 263 to 265, and four low breakdown voltage n channel MOS transistors 280 to 283 which are formed in a triple well region 301.

In the transistors 262a and 262b, a signal VERA_SW is input to a gate, any one of a source and a drain is connected to one of the source lines SL<0> and SL<1>, and VERA is applied to the other one.

In the transistor 263, any one of a source and a drain is connected to any one of a source and a drain of each of the transistors 280 and 281. In the transistor 280, a signal SW_S0VH is input to a gate, and the other one of the source and the drain is connected to the source line SL<0>. In the transistor 281, a signal SW_S1VH is input to a gate, and the other one of the source and the drain is connected to the source line SL<1>.

In the transistor 264, any one of a source and a drain is connected to any one of a source and a drain of each of the transistors 282 and 283. In the transistor 282, a signal SW_S0VL is input to a gate, and the other one of the source and the drain is connected to the source line SL<0>. In the transistor 283, a signal SW_S1VL is input to a gate, and the other one of the source and the drain is connected to the source line SL<1>.

Next, a connection between the source line and the power-supply line in the region 150 will be described. In the triple well region 300, a switch circuit 160 which controls a connection between the source line SL<0>, and the node VHSA and the node VLSA, and a connection between the source line SL<1>, and the node VHSA and the node VLSA is arranged, and low breakdown voltage n channel MOS transistors 284 to 287 are provided. In the transistor 284, a signal SW_S0VH is input to a gate, any one of a source and a drain is connected to the node VHSA, and the other one is connected to the source line SL<0>. In the transistor 285, a signal SW_S1VH is input to a gate, any one of a source and a drain is connected to the node VHSA, and the other one is connected to the source line SL<1>. In the transistor 286, a signal SW_S0VL is input to a gate, any one of a source and a drain is connected to the node VLSA, and the other one is connected to the source line SL<0>. In the transistor 287, a signal SW_S1VL is input to a gate, any one of a source and a drain is connected to the node VLSA, and the other one is connected to the source line SL<1>.

For example, when the sequencer 121 sets SW_S0VH and SW_S1VL to be in a "H" level, the transistors 280, 283, 284, and 287 are in the on state, VDDSA is applied to the source line SL<0> and the node VHSA, and VSS is applied to the source line SL<1> and the node VLSA. In addition, when the sequencer 121 sets SW_S1VH and SW_S0VL to be in the "H" level, the transistors 281, 282, 285, and 286 are in the on state, VSS is applied to the source line SL<0> and the node VLSA, and VSS is applied to the source line SL<1> and the node VLSA.

Figure 8:
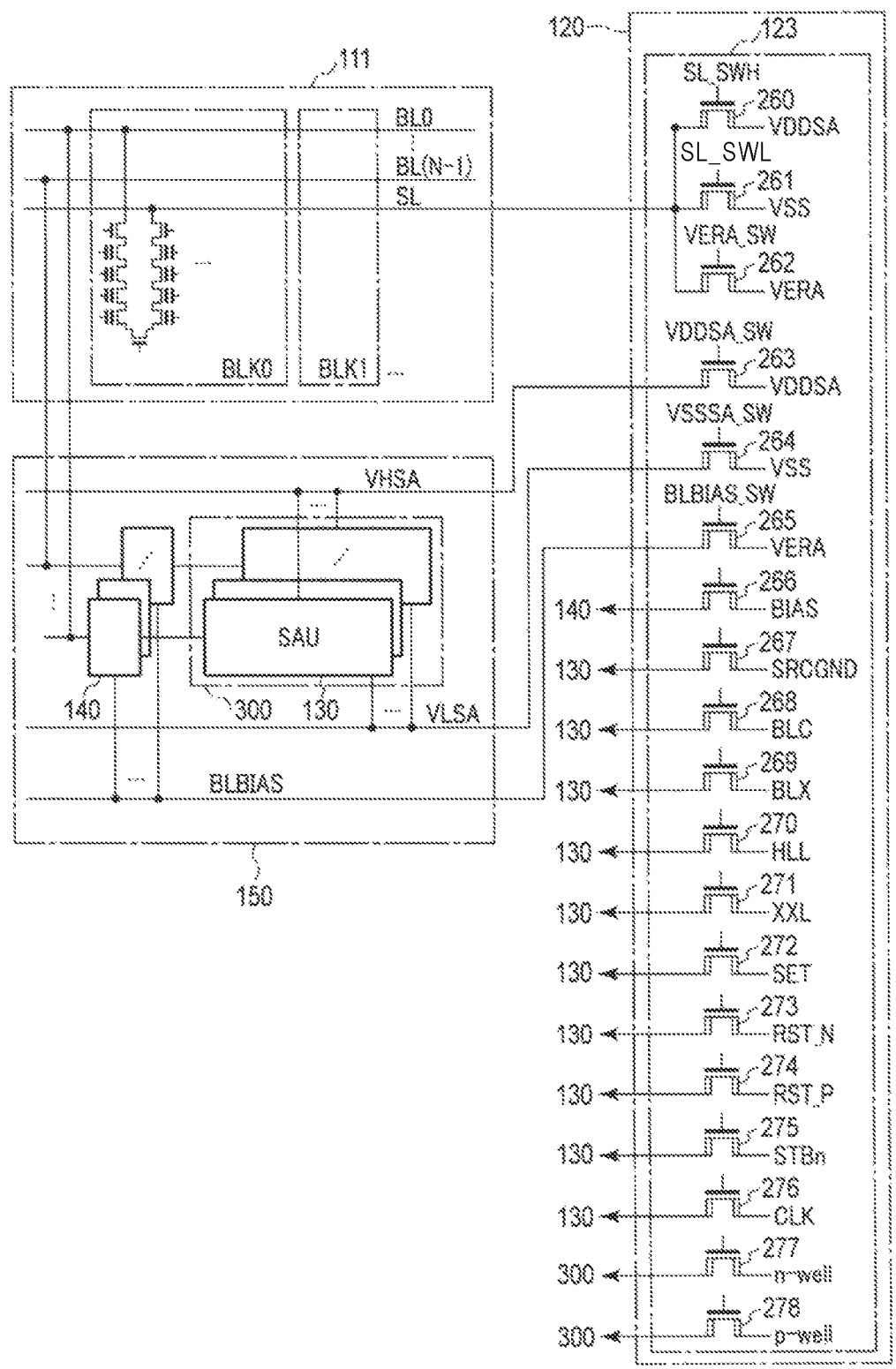
FIG. 8 is a block diagram illustrating a driver provided in the semiconductor memory device according to the second embodiment.

Furthermore, in this embodiment, the transistors 260 and 261 illustrated in FIG. 8 of the first embodiment are omitted. Specifically, a voltage is transmitted to the node VHSA and the node VLSA by the source line SL, and thus in the driver 123, the high breakdown voltage transistor for controlling the transmission of the voltage to the node VHSA and the node VLSA is omitted. Further, in this embodiment, as with the first embodiment, the node BLBIAS is connected to the transistor 265 of the driver 123, but the node BLBIAS may be connected to the source line SL<0> or SL<1>, and in this case, a transistor for controlling the connection between the node BLBIAS and the source lines SL<0> and SL<1> may be included in the switch circuit 160.

3.2 Voltage of Sense Amplifier and Source Line

Figure 14:
FIG. 14 is a table illustrating a state of a source line of the semiconductor memory device according to the third embodiment, a power-supply line of a sense amplifier, and a signal line of the driver.

Next, a voltage applied to the sense amplifier 113 and the source line SL at the time of reading, writing, and erasing the data will be described with reference to FIG. 14 to FIG. 16. In this embodiment, a voltage applied to the source line SL is different between a zone including the selected block BLK and a zone not including the selected block BLK. Hereinafter, in the writing operation, an operation of increasing a threshold voltage by injecting a charge into the charge storage layer of the memory cell transistor MT is referred to as a "program", and an operation of determining whether or not the threshold voltage reaches a desired value is referred to as "verify".

First, a case in which the selected block BLK is included in the zone Z0 will be described with reference to FIG. 14. When the data is read and verified (depicted as "Read/Verify" in FIG. 14), in the selected block BLK, a charge which is precharged to the bit line BL according to the state of the memory cell transistor flows through the source line SL, and thus VSS is applied to the source line SL. Accordingly, VSS is applied to the source line SL<0> connected to the zone Z0. On the other hand, in the non-selected block BLK, a current does not flow through the source line SL from the bit line BL. Accordingly, the select transistor ST2 is in the off state, and VDDSA is applied to the source line SL<1> connected to the zone Z1 which does not include the selected block BLK. In addition, the sense amplifier 113 senses the data read in the bit line BL from the memory cell transistor MT, and thus VDDSA is applied to the node VHSA, and VSS is applied to the node VLSA. In addition, in the reading and verifying the data, there is no wiring which applies VERA.

Accordingly, the sequencer 121 sets the signals VDDSA_SW, VSSSA_SW, SW_S1VH, and SW_S0VL to be at the "H" level, and sets the signals VERA_SW, SW_S0VH, and SW_S1VL to be at a "L" level. Accordingly, VSS is applied to the source line SL<0> and the node VLSA, and VDDSA is applied to the source line SL<1> and the node VHSA. In addition, the sequencer 121 sets the signal BLBIAS_SW to be in the "L" level.

Next, a case in which the data is programmed (depicted as "Program" in FIG. 14) will be described. When the data is programmed, in the selected block BLK, a charge is supplied to the memory cell transistor MT which is a program target from the bit line BL. At this time, the select transistor ST2 is in the off state, and VDDSA is applied to the source line SL. Accordingly, VDDSA is applied to the source line SL<0> connected to the zone Z0. On the other hand, VSS is applied to the source line SL<1> connected to the zone Z1 which does not include the selected block BLK. In addition, the sense amplifier 113 transmits the write data to the memory cell transistor MT, and thus VDDSA is applied to the node VHSA, and VSS is applied to the node VLSA. In addition, in the programming the data, there is no wiring which applies VERA.

Accordingly, the sequencer 121 sets the signals VDDSA_SW, VSSSA_SW, SW_S0VH, and SW_S1VL to be at the "H" level, and sets the signals VERA_SW, SW_S1VH, and SW_S0VL to be at the "L" level. Accordingly, VDDSA is applied to the source line SL<0> and the node VHSA, and VSS is applied to the source line SL<1> and the node VLSA. In addition, the sequencer 121 also sets the signal BLBIAS_SW to be in the "L" level.

Next, a case in which the data is erased (depicted as "Erase" in FIG. 14) will be further described with reference to FIG. 15. When the data is erased, VERA is applied to the source lines SL<0> and SL<1>. In addition, the node VHSA and the node VLSA are in the floating state.

Figure 15:
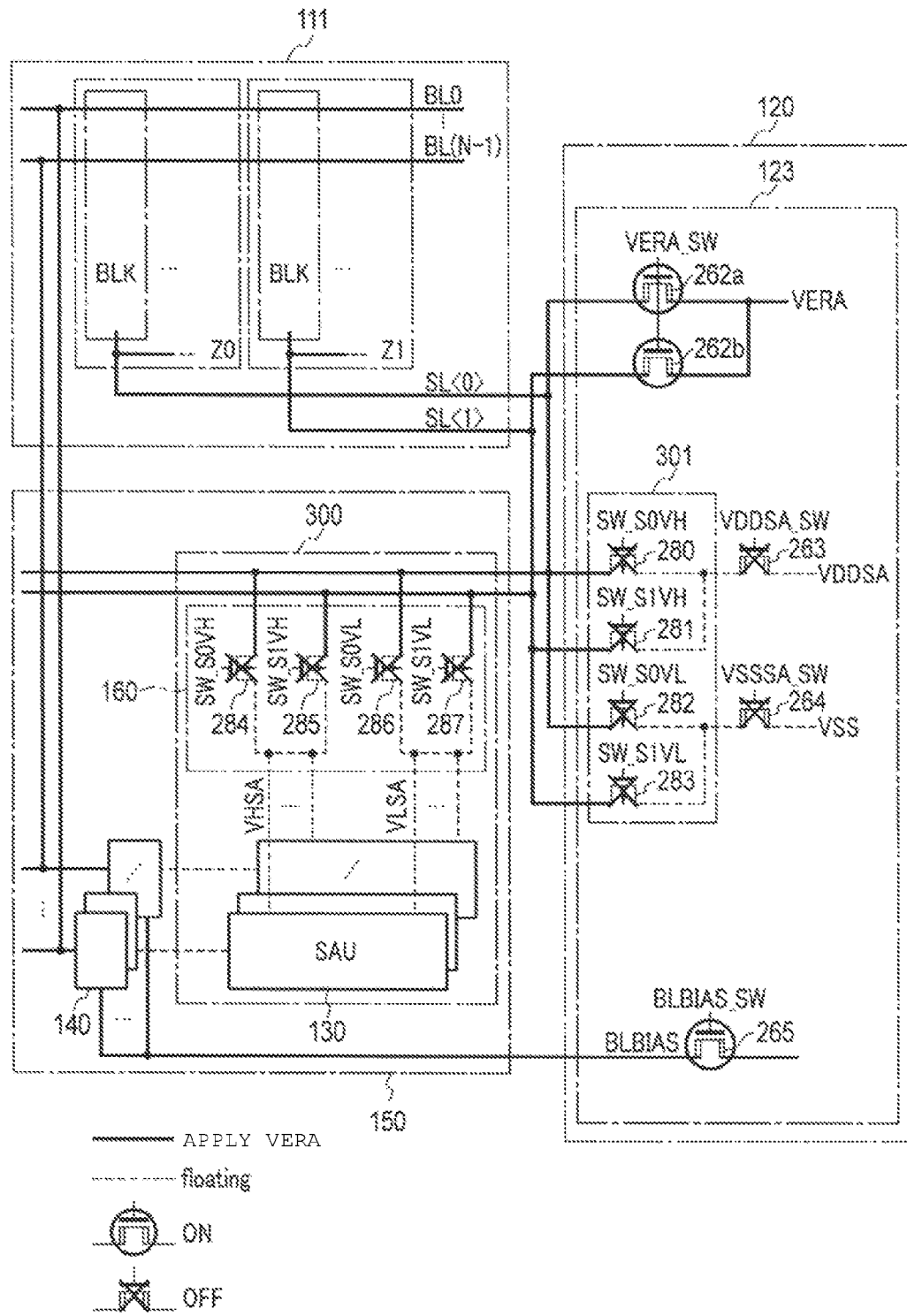
FIG. 15 is a block diagram illustrating a connection of the driver at the time of erasing of the semiconductor memory device according to the third embodiment.

Specifically, as illustrated in FIG. 15, the sequencer 121 sets the signal VERA_SW to be at the "H" level, and sets the transistors 262a and 262b to be in the on state. In addition, the sequencer 121 sets the signals VDDSA_SW and VSSSA_SW to be at the "L" level, and sets the transistors 263 and 264 to be in the off state. Then, the sequencer 121 sets the wiring for transmitting the signals SW_S0VH, SW_S1VH, SW_S0VL, and SW_S1VL to be in the floating state, and sets the transistors 280 to 287 to be in the off state. Accordingly, VERA is applied to the source lines SL<0> and SL<1>, and the node VHSA and the node VLSA are in the floating state.

Then, as described in the second embodiment, the potential of the wiring for transmitting the signals SW_S0VH, SW_S1VH, SW_S0VL, and SW_S1VL, the node VHSA, and the node VLSA is higher than the power-supply voltage VDD due to the capacitance coupling with respect to the bit line BL, the source line SL, the back gate line BG of the non-selected block, the node BLBIAS, and the node BIAS, and for example, increases to approximately VERA. In addition, in the triple well region 301, the n type well 21, the p type well 22, the wiring between the transistors 280 and 281 and the transistor 263, and the wiring between the transistors 282 and 283 and the transistor 264 are in the floating state. Then, the potential of the wells and wirings, for example, increases to approximately VERA due to the capacitance coupling with respect to the wiring to which VERA is applies, for example, the wiring connected to the transistors 262a, 262b, and 265.

Next, a case in which the selected block BLK as a processing target of the data is included in the zone Z1 will be described with reference to FIG. 16. As illustrated, in FIG. 16, the potentials of the source line SL<0> and the source line SL<1> in FIG. 14 are reversed. Accordingly, the "H"/"L" levels of the signals SW_S0VH, SW_S1VH, SW_S0VL, and SW_S1VL at the time of reading and writing the data are reversed. In addition, the states of the respective signals (the signals VDDSA_SW, VSSSA_SW, VERA_SW, SW_S0VH, SW_S1VH, SW_S0VL, and SW_S1VL) at the time of erasing the data are the same for the source line SL<0> and the source line SL<1>.

3.3 Effect of this Embodiment

According to the configuration of this embodiment, the same effect as that of the first embodiment and the second embodiment described above is able to be obtained.

In addition, in the configuration according to this embodiment, any one of the source lines SL<0> and SL<1> is connected to the node VHSA and the node VLSA, and thus the voltage of the source line SL is able to be transmitted. For this reason, in the driver 123, it is possible to omit the high breakdown voltage transistor for transmitting a voltage to the node VHSA and the node VLSA. Accordingly, it is possible to reduce the number of high breakdown voltage transistors. Accordingly, it is possible to reduce the chip area.

Further, in this embodiment, the triple well region 301 is arranged in the driver 123, and the low breakdown voltage n channel MOS transistors 280 to 283 for controlling the connection with respect to the source lines SL<0> and SL<1> are arranged on the triple well region 301. Accordingly, for example, even when VERA is applied to any one of the source and the drain of the transistors 280 to 283 at the time of erasing the data, the potential of the gate, the other one of the source and the drain, and the substrate bias (the n type well 21 and the p type well 22) increases to approximately VERA due to the capacitance coupling, and thus it is possible to prevent a high voltage difference from occurring in the transistor. Accordingly, it is possible to configure the transistors 280 to 283 as the low breakdown voltage transistor, and thus it is possible to suppress an increase in the area of the driver 123. Accordingly, it is possible to suppress an increase in the chip area.

Furthermore, a case in which the n type well 21 and the p type well 22 of the triple well region 301 are in the floating state is described, but in other embodiments, VERA may be applied to the n type well 21 and the p type well 22 of the triple well region 301.

Further, in other embodiments, the triple well region 301 may be divided into a plurality of triple well regions.

Further, in other embodiments, the triple well region 301 may be arranged in the region 150.

4. Fourth Embodiment

Next, a semiconductor memory device according to a fourth embodiment will be described. In this embodiment, the configuration of the memory cell array 111 in the first embodiment to the third embodiment is modified. In this embodiment, a case will be described in which a different memory cell array 111 is applied to the first embodiment. Hereinafter, only differences from the first embodiment will be described.

4.1 Configuration of Memory Cell Array

Figure 17:
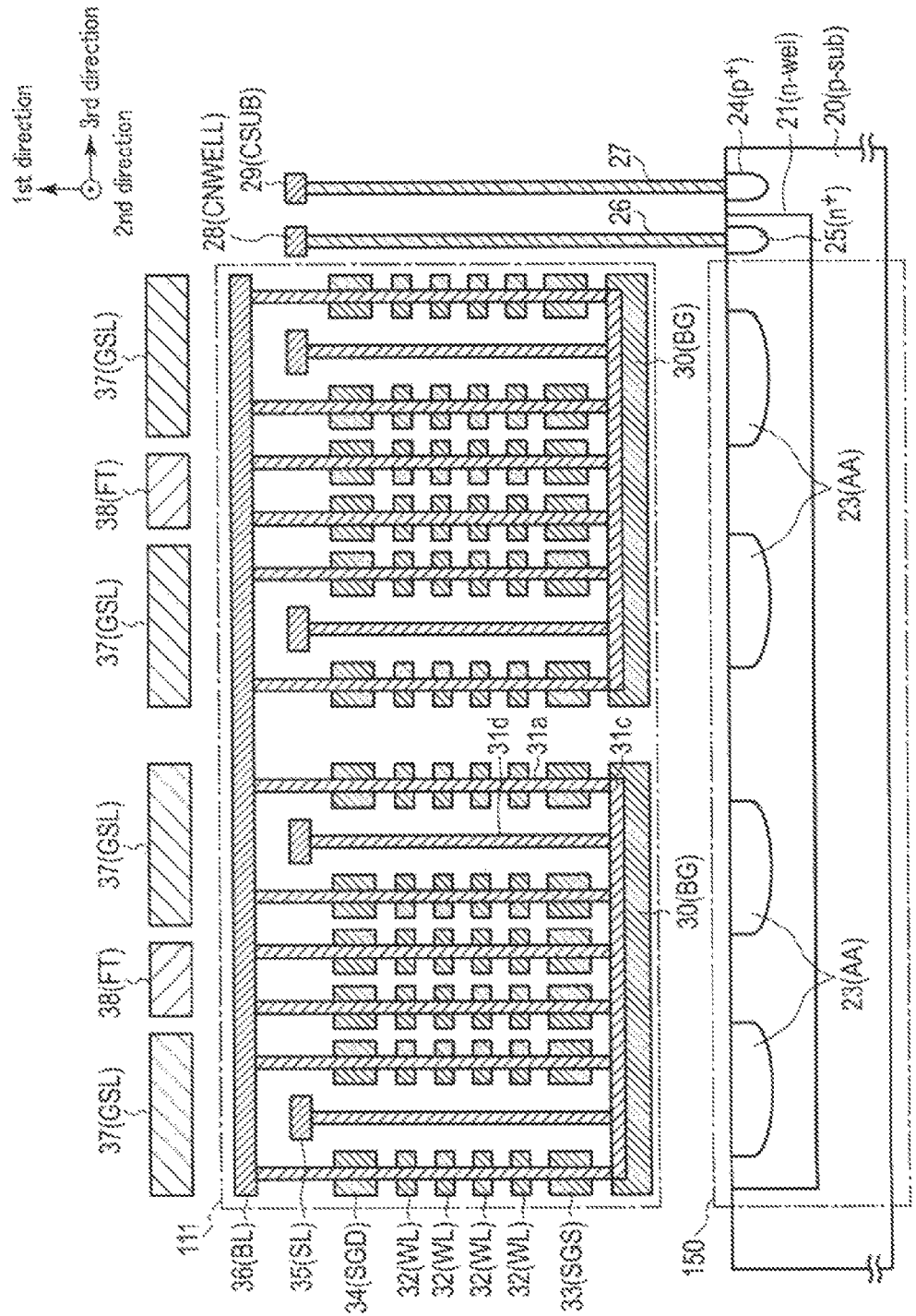
FIG. 17 is a sectional view of a memory cell array and a semiconductor substrate provided in a semiconductor memory device according to a fourth embodiment.

The sectional configuration of the memory cell array 111 according to this embodiment will be described with reference to FIG. 17. In the configuration according to this embodiment, the select transistor ST2, the memory cell transistor MT, and the select transistor ST1 which form the NAND string 116 are stacked in the first direction.

As illustrated, the wiring layer 30 (the back gate line BG), the wiring layer 33 (the select gate line SGS), the wiring layer 32 (the word line WL), and the wiring layer 34 (the select gate line SGD) are sequentially arranged on the upper portion of the semiconductor substrate 20 in the first direction. Then, a semiconductor layer 31c is formed on the wiring layer 30. In addition, an insulating film (not illustrated) is formed between the respective wirings. Furthermore, the number of wirings of the select gate lines SGS and SGD, and the word line WL is able to be arbitrarily changed according to the number of select transistors ST1 and ST2 and memory cell transistors MT.

The semiconductor layer 31c functions as a part of the node which connects the source line SL to the select transistor ST2. Furthermore, the wiring layer 30 may be omitted.

In addition, a memory hole is formed to reach the semiconductor layer 31c through the wiring layers 32 to 34, and a semiconductor layer 31a which functions as a current path of the NAND string 116 is formed therein. One end of the semiconductor layer 31a is connected to the semiconductor layer 31c, and the other end is connected to the bit line BL, and thus the NAND string 116 is formed. In addition, a contact hole which connects the wiring layer 35 (the source line SL) to the semiconductor layer 31c is formed in a region in which the wiring layers 32 to 34 are not formed, and a semiconductor layer 31d is formed therein.

4.2 Effect of this Embodiment

According to the configuration of this embodiment, the same effect as that of the first embodiment to the third embodiment described above is able to be obtained.

5. Fifth Embodiment

Next, a semiconductor memory device according to a fifth embodiment will be described. In this embodiment, the configuration of the memory cell array 111 in the first embodiment to the fourth embodiment is modified. In this embodiment, a case will be described in which a memory cell array 111 is applied to the first embodiment. Hereinafter, only differences from the first embodiment will be described.

5.1 Configuration of Memory Cell Array

First, the configuration of the memory cell array 111 according to this embodiment will be described with reference to FIG. 18.

As illustrated, the memory cell array 111 includes a plurality of memory units MU (MU1 and MU2) in each of the blocks BLK. In FIG. 18, only two memory units MU are illustrated, but the number of memory units is not limited, and may be greater than or equal to three.

Each of the memory units MU, for example, includes four string groups GR (GR1 to GR4). Obviously, the number of string groups GR is not limited to four, but may be less than or equal to three, or may be greater than or equal to five.

Each of the string groups GR, for example, includes three NAND strings SR (SR1 to SR3). Obviously, the number of NAND strings SR is not limited to three, but may be greater than or equal to four. Each of the NAND strings SR includes the select transistors ST1 and ST2, and four memory cell transistors MT (MT1 to MT4). The number of memory cell transistors MT is not limited to four, but be greater than or equal to five, or may be less than or equal to three.

In the string group GR, the three NAND strings SR1 to SR3 are sequentially stacked on the upper portion of the semiconductor substrate 20, in which the NAND string SR1 is formed on a lowermost layer, the NAND string SR2 is formed on an intermediate layer, and the NAND string SR3 is formed on an uppermost layer. The gates of the select transistors ST1 and ST2 included in the same string group GR are respectively connected to the same select gate lines GSL1 and GSL2, and a control gate of the memory cell transistor MT positioned in the same column is connected to the same word line WL. Further, the drains of three select transistors ST1 in a certain string group GR are connected to the bit lines BL which are different from each other through a column select transistor CSG, and the sources of the select transistors ST2 are connected to the same source line SL.

Specifically, the drains of the select transistors ST1 of the odd-numbered string groups GR1 and GR3 are respectively connected to the sources of column select transistors CSG1 and CSG3, and the sources of the select transistors ST2 are connected in common to the source line SL1. On the other hand, the drains of the select transistors ST1 of the even-numbered string groups GR2 and GR4 are respectively connected to sources of the column select transistors CSG2 and CSG4, and the sources of the select transistors ST2 are connected in common to the source line SL2.

Then, the gates of the select transistors ST1 of the string groups GR1 and GR3 and the gates of the select transistors ST2 of the string groups GR2 and GR4 are connected in common to the same select gate line GSL1. In addition, the gates of the select transistors ST2 of the string groups GR1 and GR3 and the gates of the select transistors ST1 of the string groups GR2 and GR4 are connected in common to the same select gate line GSL2.

In addition, in the string groups GR1 and GR3, the control gates of the memory cell transistors MT1, MT2, MT3, and MT4 are respectively connected to the word lines WL1, WL2, WL3, and WL4. In contrast, in the string groups GR2 and GR4, the control gates of the memory cell transistors MT4, MT3, MT2, and MT1 are respectively connected to the word lines WL1, WL2, WL3, and WL4.

In addition, the NAND strings SR1 of the four string groups GR1 to GR4 included in a certain memory unit MU are connected to the same bit line BL. The same is true for the NAND strings SR2 and SR3. In addition, different memory units MU are connected to different bit lines BL. More specifically, in the memory unit MU1, the drains of the select transistors ST1 of the NAND strings SR1 to SR3 of each the string groups GR1 to GR4 are respectively connected to the bit lines BL1 to BL3 through the column select transistors CSG (CSG1 to CSG4). The column select transistors CSG, for example, have the same configuration as those of the memory cell transistors MT, the select transistors ST1 and ST2, and the like, and select one string group GR which will be connected to the bit lines BL. Accordingly, gates of the column select transistors CSG1 to CSG4 associated with the respective string groups GR are respectively controlled by different control signal lines SSL1 to SSL4.

Figure 18:
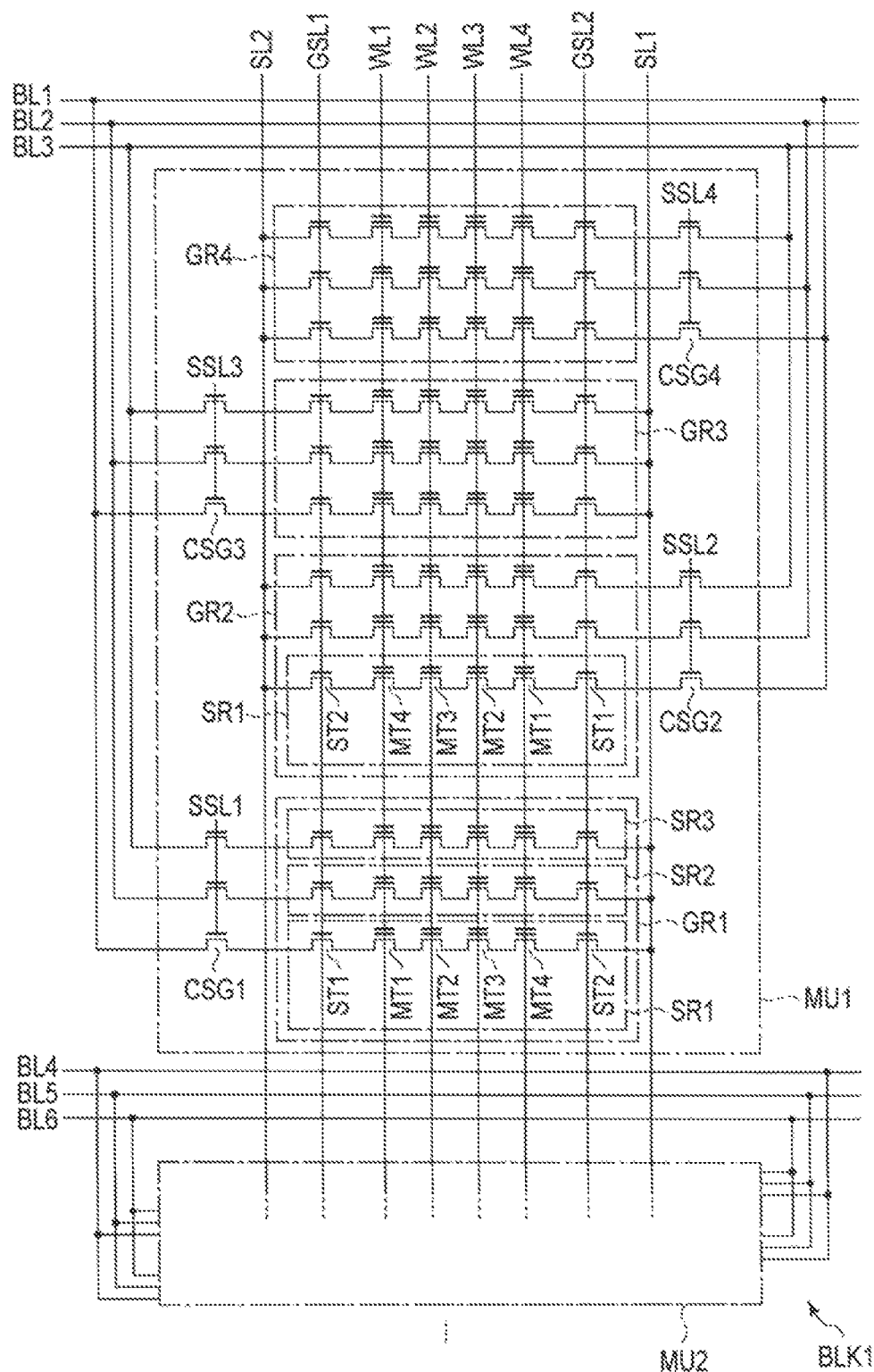
FIG. 18 is a circuit diagram of a memory cell array provided in a semiconductor memory device according to a fifth embodiment.

A plurality of memory units MU each having the configuration described above is arranged in an up and down direction in the plane of FIG. 18. The plurality of memory units MU share the word lines WL, and the select gate lines GSL1 and GSL2. On the other hand, the bit lines BL are separately provided for each memory unit, and for example, three bit lines BL4 to BL6 are associated with the memory unit MU2. That is, the number of bit lines BL associated with the respective memory units MU corresponds to the total number of NAND strings SR included in one string group GR. Accordingly, when the NAND string SR includes four layers, the number of bit lines corresponding to one memory unit MU is four, and the same applies to other numbers. In addition, the control signal lines SSL1 to SSL4 are in common between the memory units MU.

Figure 19:
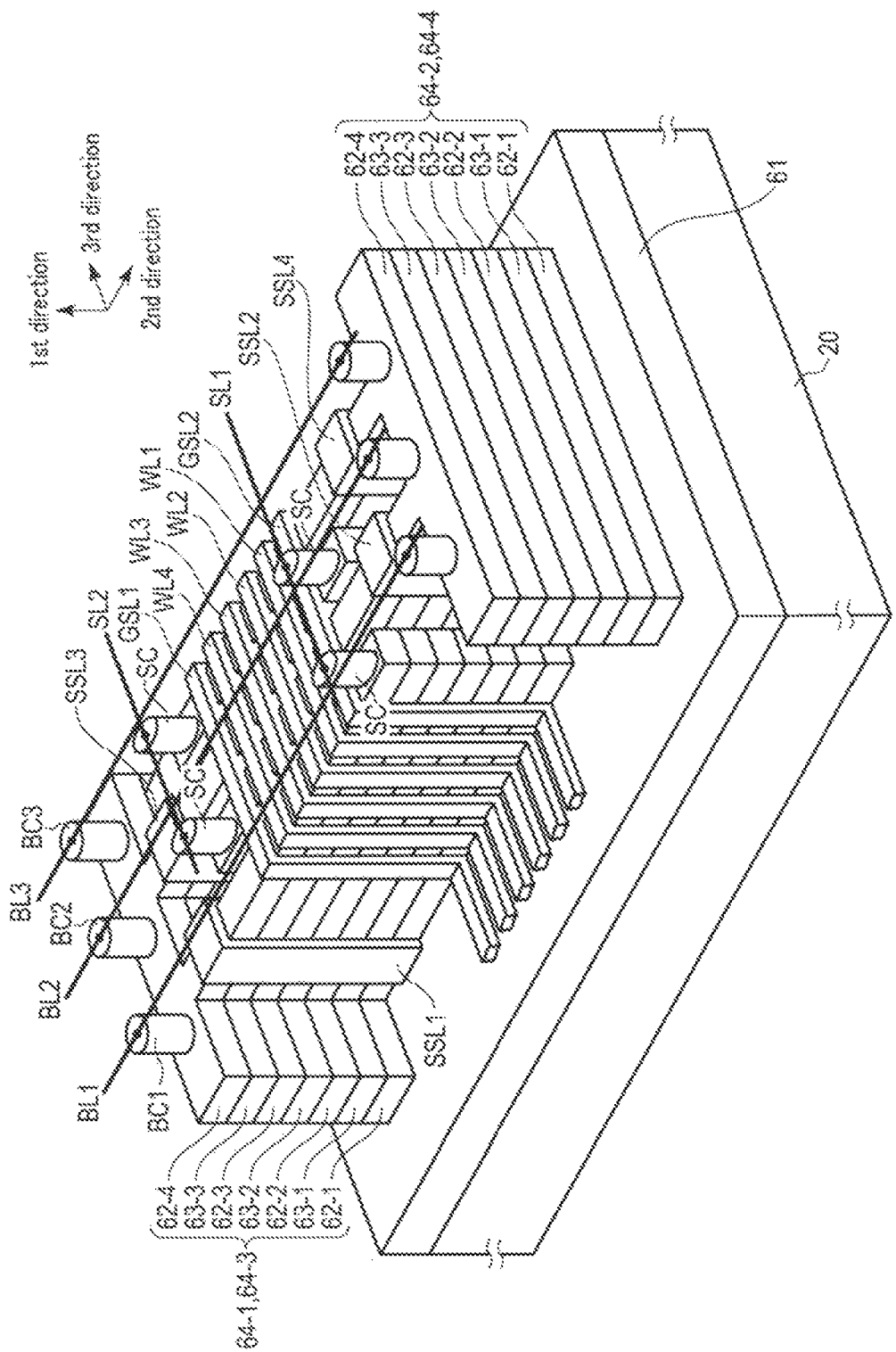
FIG. 19 is a perspective view of the memory cell array provided in the semiconductor memory device according to the fifth embodiment.
Figure 20:
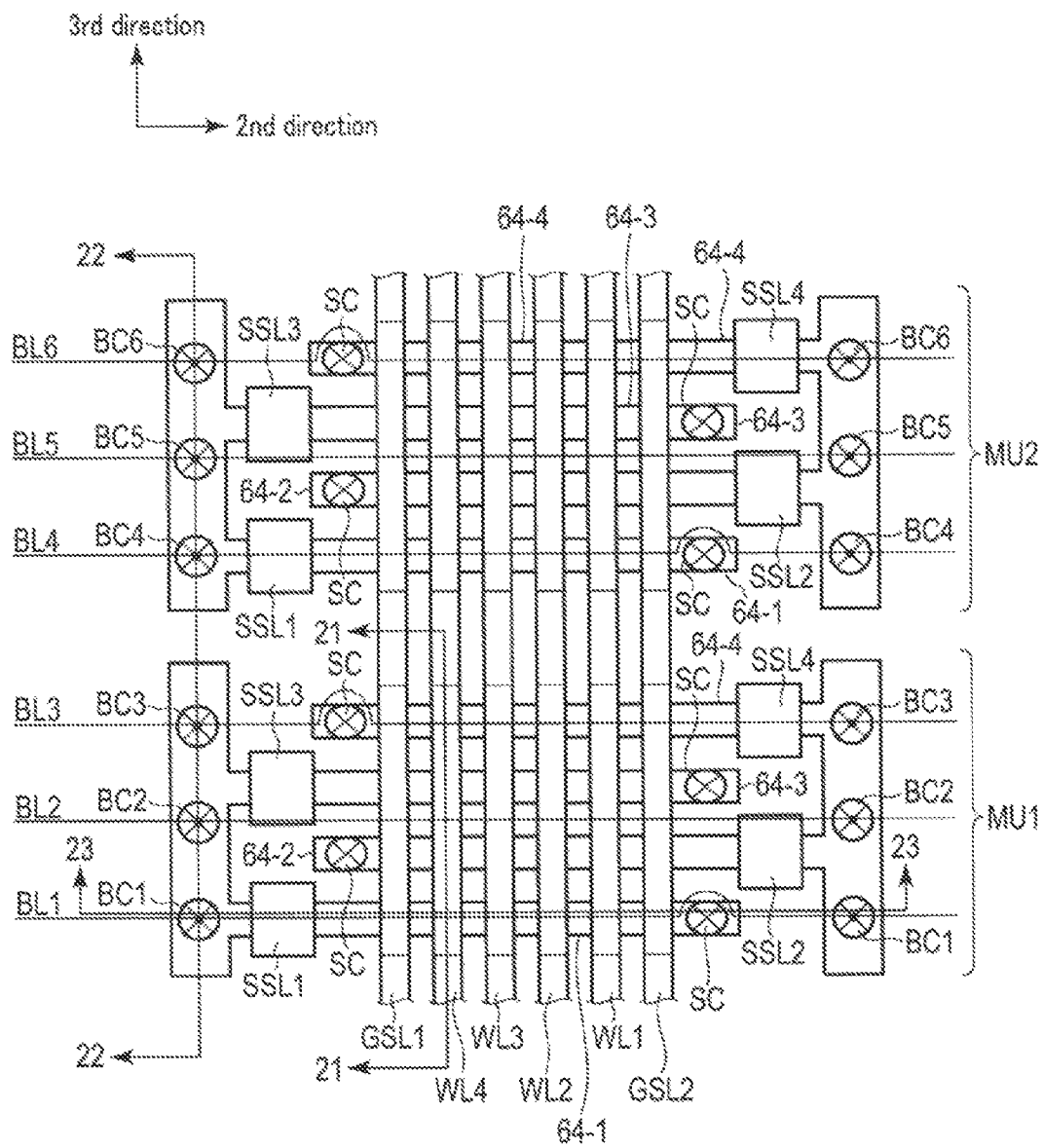
FIG. 20 is a plan view of the memory cell array provided in the semiconductor memory device according to the fifth embodiment.
Figure 21:
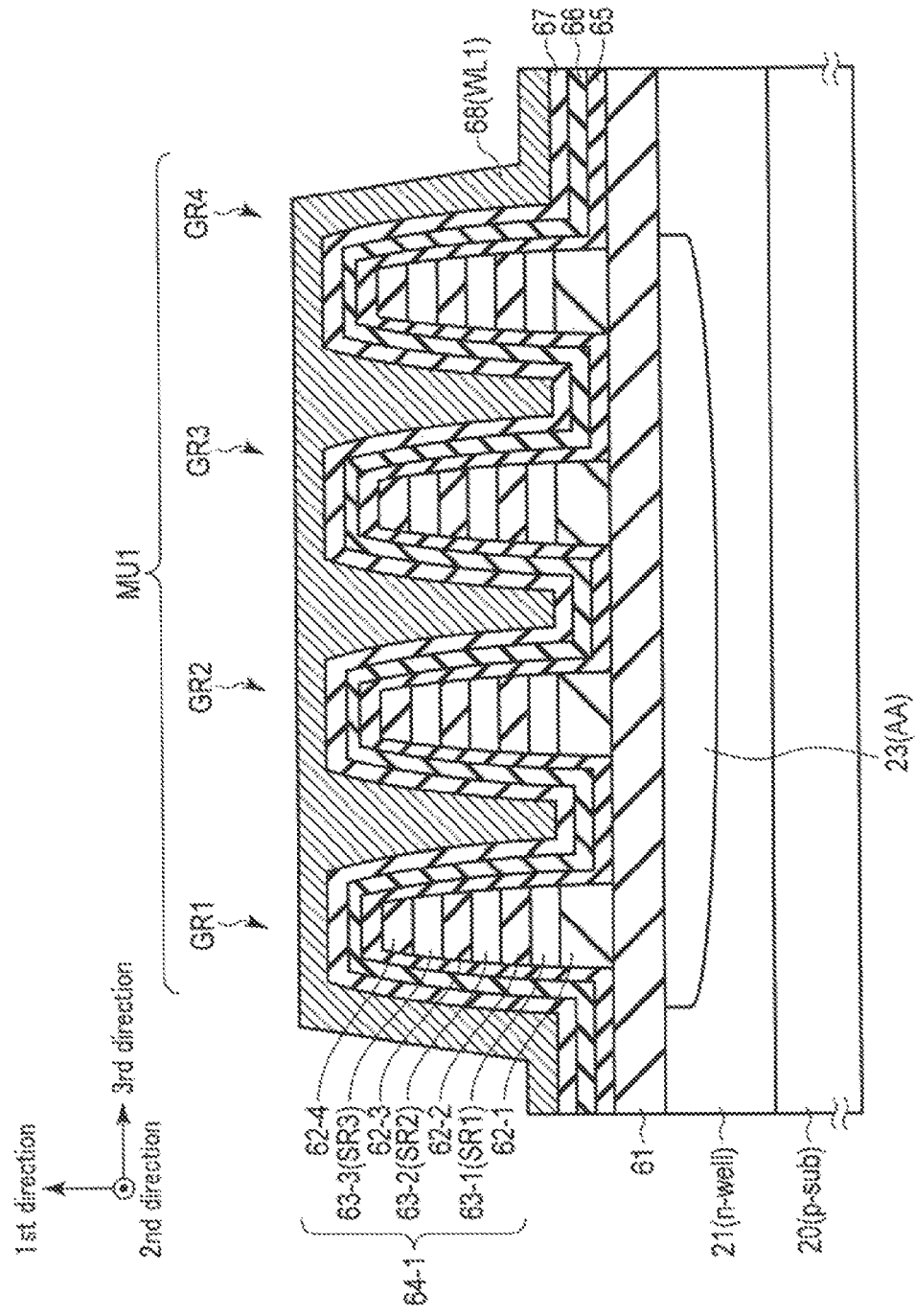
FIG. 21 is a sectional view cut along line XXI-XXI of FIG. 20.
Figure 22:
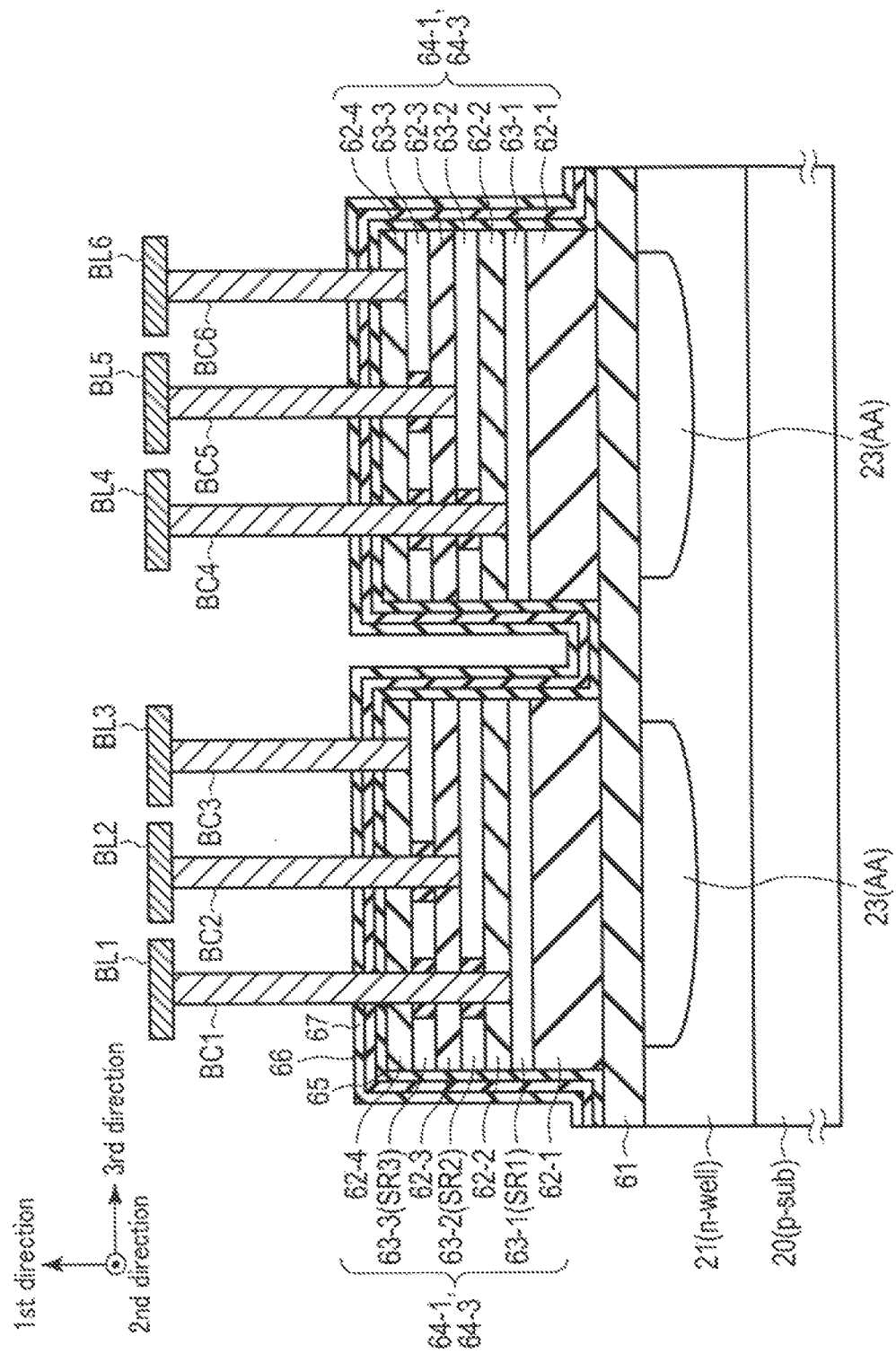
FIG. 22 is a sectional view cut along line XXII-XXII of FIG. 20.
Figure 23:
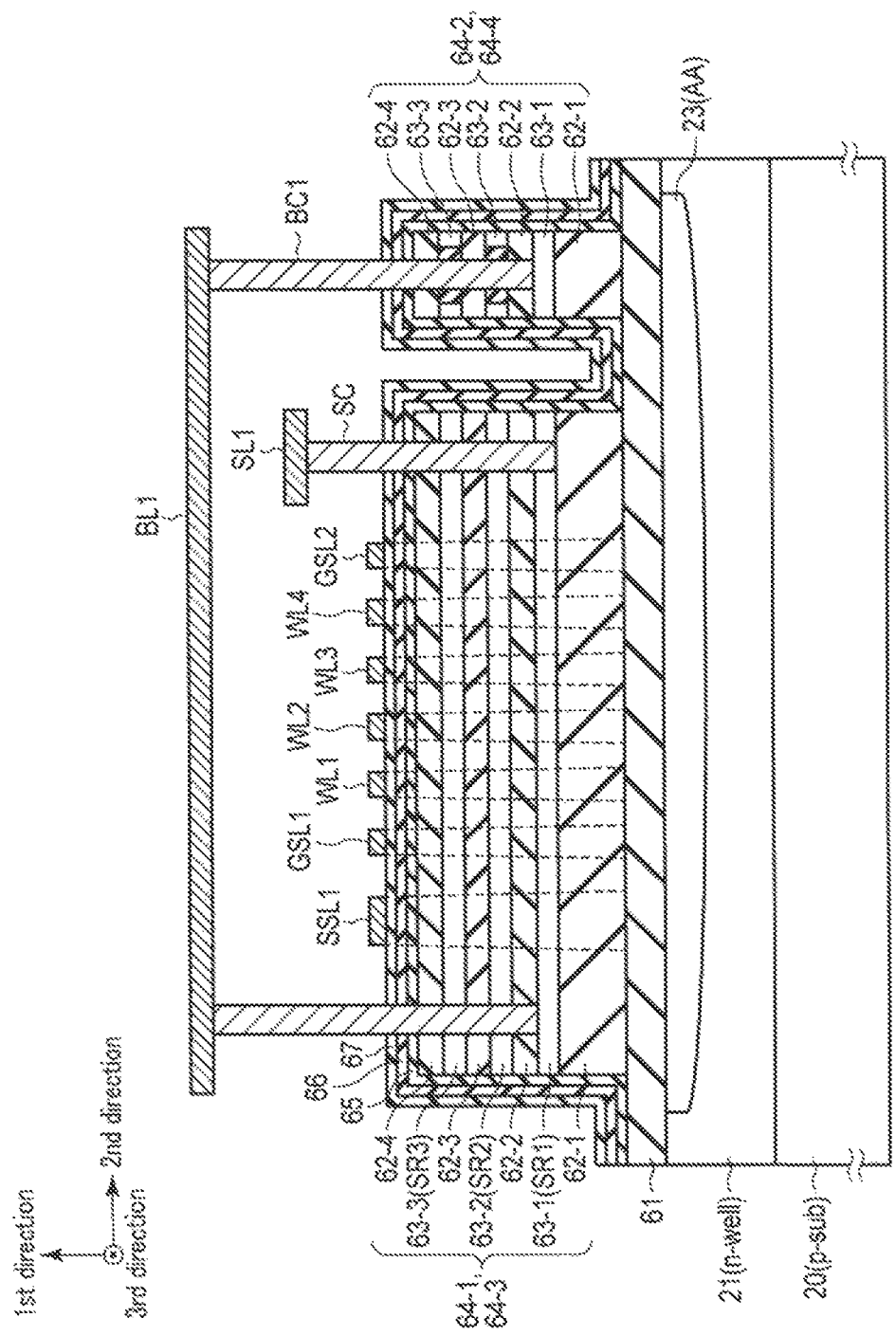
FIG. 23 is a sectional view cut along line XXIII-XXIII of FIG. 20.

FIG. 19 is a perspective view of the memory cell array 111, FIG. 20 is a plan view of the memory cell array 111, FIG. 21 is a sectional view cut along line XXI-XXI of FIG. 20, FIG. 22 is a sectional view cut along line XXII-XXII of FIG. 20, and FIG. 23 is a sectional view cut along line XXIII-XXIII of FIG. 20. FIG. 19, FIG. 21, and FIG. 23 illustrate the memory unit MU1, and FIG. 20 and FIG. 22 illustrate the memory units MU1 and MU2.

Figure 3:
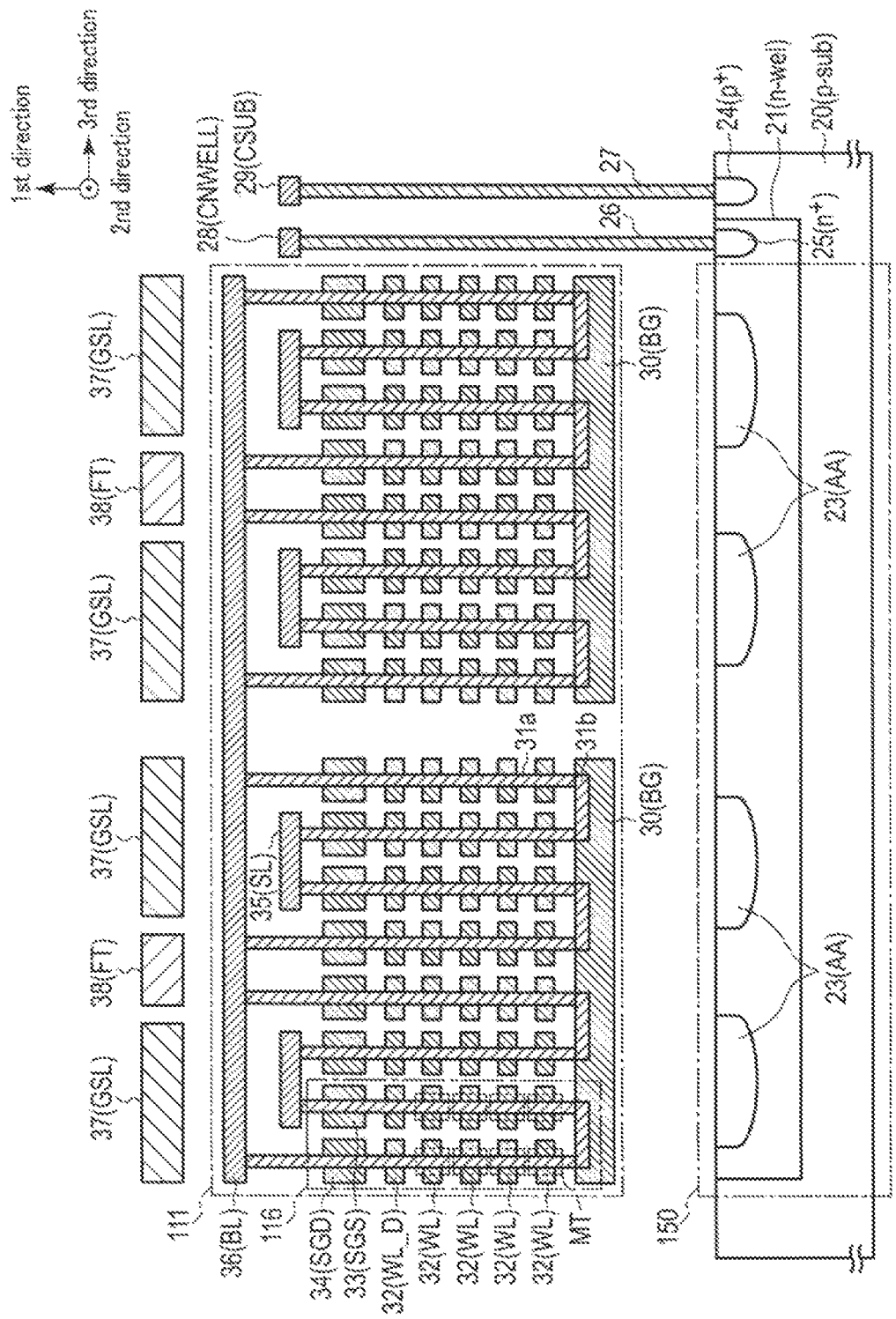
FIG. 3 is a sectional view of the memory cell array and a semiconductor substrate provided in the semiconductor memory device according to the first embodiment.

As illustrated, for example, the n type well 21 is arranged in the vicinity of the surface of the semiconductor substrate 20 in the region 150, as with FIG. 3 of the first embodiment, and the element region 23 which is separated from the element separation region (not illustrated) is arranged in the surface region of the n type well 21.

An insulating film 61 is formed on the semiconductor substrate 20. The memory cell array 111 is formed on an upper portion of the insulating film 61. Specifically, a stacked body 64 in which an insulating film 62 (62-1 to 62-4) and a semiconductor layer 63 (63-1 to 63-3) extending towards a second direction horizontal to the surface of the semiconductor substrate 20 are alternately stacked is arranged towards a third direction in the shape of a stripe. Each stacked body 64 corresponds to the string group GR illustrated in FIG. 18. The semiconductor layer 63-1 on the lowermost layer corresponds to the current path of the NAND string SR1 (a region in which a channel is formed), the semiconductor layer 63-3 on the uppermost layer corresponds to the current path of the NAND string SR3, and the semiconductor layer 63-2 positioned therebetween corresponds to the current path of the NAND string SR2.

A tunnel insulating film 65, a charge storage layer 66, a block insulating film 67, and a conductive film 68 are sequentially formed on an upper surface and a side surface of the stacked body 64 (refer to FIG. 21). The conductive film 68 functions as the word line WL or the select gate lines GSL1 and GSL2. The word line WL and the select gate lines GSL1 and GSL2 are formed between the plurality of memory units MU to cross the plurality of stacked bodies 64. On the other hand, the control signal lines SSL1 to SSL4 are independent for each of the stacked bodies 64.

In the stacked body 64, one end portion thereof is drawn out to an end portion of the memory cell array 111, and is connected to the bit line BL in the drawn-out region. That is, as an example, in the memory unit MU1, one end portions of the odd-numbered stacked bodies 64-1 and 64-3 are drawn out to a certain region along the second direction and are connected in common, and contact plugs BC1 to BC3 are formed in this region. The contact plug BC1 formed in this region is connected to the semiconductor layer 63-1 of the string groups GR1 and GR3 and the bit line BL1, and is insulated from the semiconductor layers 63-2 and 63-3. The contact plug BC2 is connected to the semiconductor layer 63-2 of the string groups GR1 and GR3 and the bit line BL2, and is insulated from the semiconductor layers 63-1 and 63-3. The contact plug BC3 is connected to the semiconductor layer 63-3 of the string groups GR1 and GR3 and the bit line BL3, and is insulated from the semiconductor layers 63-1 and 63-2.

On the other hand, one end portions of the even-numbered stacked bodies 64-2 and 64-4 are drawn out to a region facing the one end portions of the stacked bodies 64-1 and 64-3 in the second direction and are connected in common, and the contact plugs BC1 to BC3 are formed in this region. The contact plug BC1 formed in this region is connected to the semiconductor layer 63-1 of the string groups GR2 and GR4 and the bit line BL1, and is insulated from the semiconductor layers 63-2 and 63-3. The contact plug BC2 is connected to the semiconductor layer 63-2 of the string groups GR2 and GR4 and the bit line BL2, and is insulated from the semiconductor layers 63-1 and 63-3. The contact plug BC3 is connected to the semiconductor layer 63-3 of the string groups GR2 and GR4 and the bit line BL3, and is insulated from the semiconductor layers 63-1 and 63-2.

As described above, the odd-numbered stacked bodies 64-1 and 64-3 (that is, the string groups GR1 and GR3) and the even-numbered stacked bodies 64-2 and 64-4 (that is, the string groups GR2 and GR4) are arranged such that the NAND strings SR are arranged to be opposite to each other. For example, in FIG. 20, the odd-numbered stacked bodies 64-1 and 64-3 are connected to the bit line BL on a left side in the drawing, and the control signal lines SSL1 and SSL3 are arranged on the left side in the drawing. Accordingly, the select transistor ST1 is positioned on the left side in the drawing, and the select transistor ST2 is positioned on a right side in the drawing. In addition, the memory cell transistors MT1 to MT4 are positioned in the order of the memory cell transistors MT1 to MT4 from the left side in the drawing. In contrast, the even-numbered stacked bodies 64-2 and 64-4 are connected to the bit line BL on the right side in the drawing, and the control signal lines SSL2 and SSL4 are arranged on the right side in the drawing. Accordingly, the select transistor ST1 is positioned on the right side in the drawing, and the select transistor ST2 is positioned on the left side in the drawing. In addition, the memory cell transistors MT1 to MT4 are positioned in the order of the memory cell transistors MT1 to MT4 from the right side in the drawing.

Obviously, the above description is for a case of the memory unit MU1, and for example, in a case of the memory unit MU2, contact plugs BC4 to BC6 are formed, and the contact plugs BC4 to BC6 connect the semiconductor layers 63-1 to 63-3 to the bit lines BL4 to BL6, respectively (refer to FIG. 22).

In addition, a contact plug SC is formed on the other end of the stacked body 64. The contact plug SC connects the semiconductor layers 63-1 to 63-3 to the source line SL.

5.2 Voltage in Erasing

Figure 24:
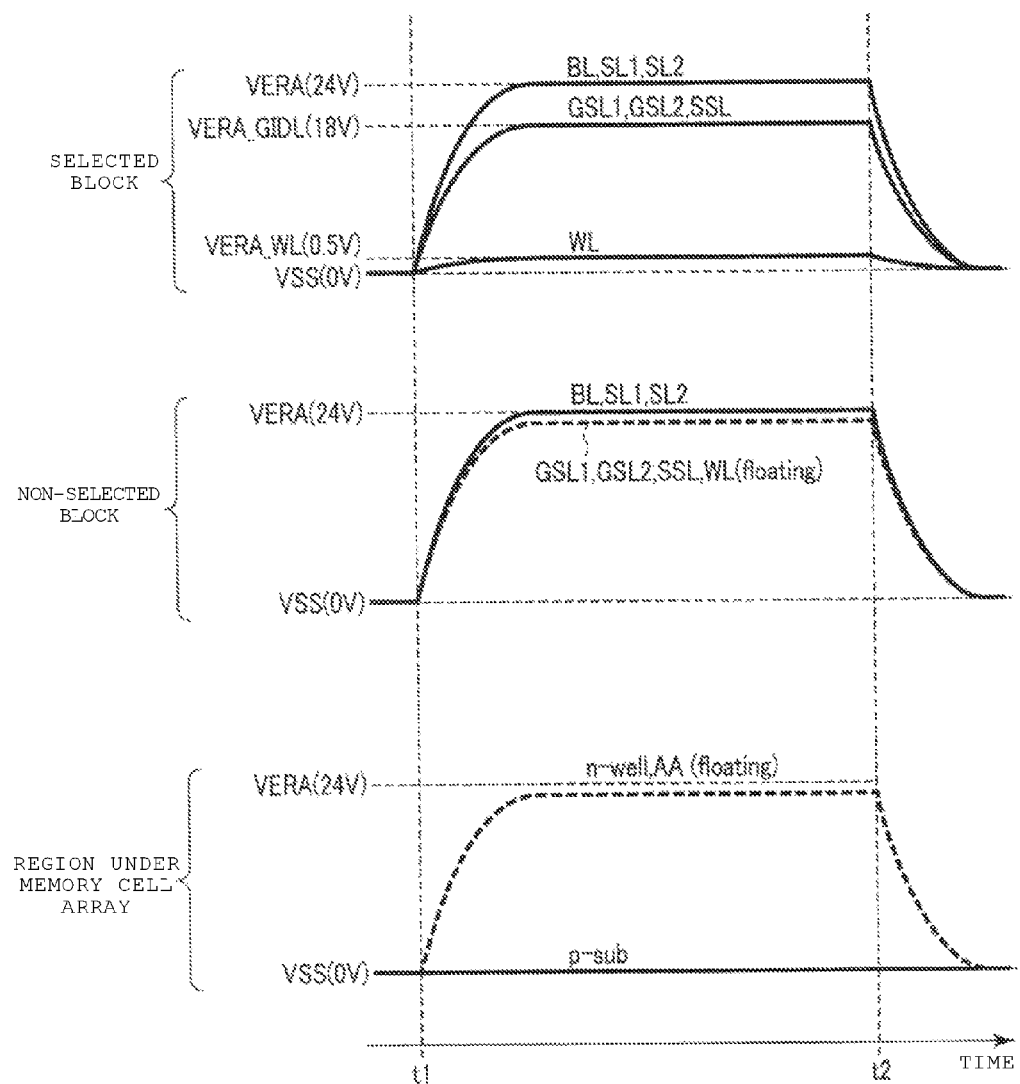
FIG. 24 is a timing diagram illustrating a potential of various lines at the time of erasing of the semiconductor memory device according to the fifth embodiment.

Next, a potential relationship of each wiring at the time of erasing the data will be described with reference to FIG. 24. As illustrated, in the selected block BLK, a voltage applied to the bit line BL, the source line SL (SL1 and SL2), and the word line WL is identical to that in FIG. 5. In addition, in this embodiment, GIDL is generated in the select transistors ST1 and ST2 and the column select transistor CSG. Accordingly, the row decoder 112 applies VERA-GIDL (for example, 18 V) to the select gate lines GSL1 and GSL2 and the control signal line SSL.

In the non-selected block BLK, the word line WL, the select gate lines GSL1 and GSL2, and the control signal line SSL are in the floating state, and the potential, for example, increases to approximately VERA due to the capacitance coupling with respect to the source lines SL1 and SL2 and the bit line BL.

In the region 150, the n type well 21 and the element region 23 are in the floating state. Then, in this embodiment, the potential of the n type well 21 and the element region 23, for example, increases to approximately VERA due to the capacitance coupling with respect to the bit line BL, the source line SL, and the semiconductor layer 63-1 connected thereto.

5.3 Effect of this Embodiment

According to the configuration of this embodiment, the same effect as that of the first embodiment to the fourth embodiment described above is able to be obtained.

6. Modification Example and the Like

The semiconductor memory device according to the embodiment described above includes a first conductivity type first well 21 (a reference numeral of 21 in FIG. 3), the memory cell array 111 (a reference numeral of 111 in FIG. 3) including a first memory cell transistor MT (a reference numeral of MT in FIG. 3) which is arranged on an upper portion of the first well 21, and first wiring (for example, a reference numeral of 36 in FIG. 3) which is connected to the first memory cell transistor MT. A positive first voltage (VERA applied to BL in FIG. 5) is applied to the first wiring at the time of erasing the data, and the potential of the first well 21 increases to a positive second voltage (an n-well potential of the semiconductor substrate under the array in FIG. 5).

By applying the embodiment described above, it is possible to provide a semiconductor memory device which is able to reduce the power consumption.

Furthermore, the embodiments are not limited to the aspects described above, but may be modified.

Figure 25:
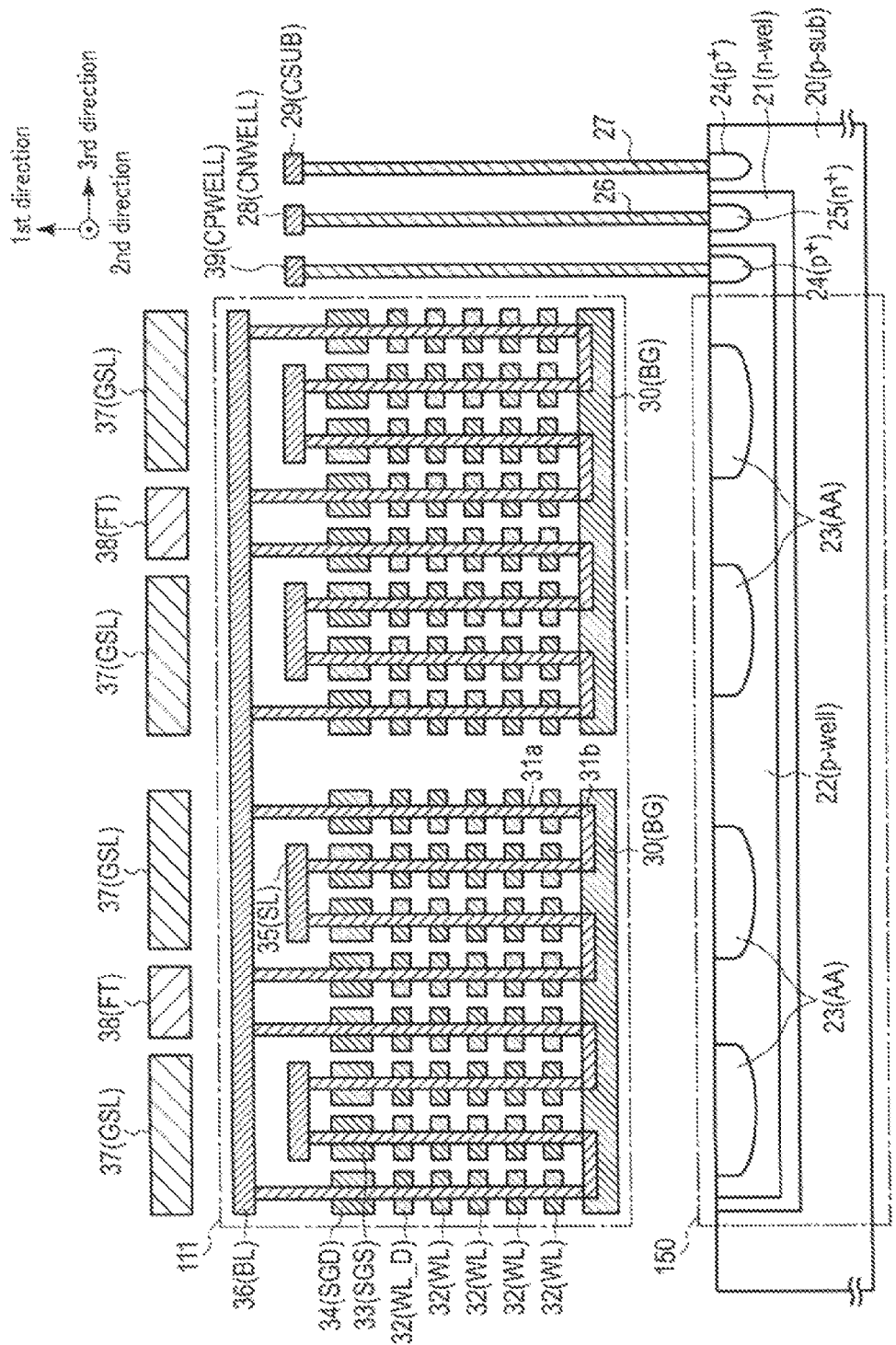
FIG. 25 is a sectional view of a memory cell array and a semiconductor substrate provided in a semiconductor memory device according to a modification example of the first embodiment.

For example, in the embodiments described above, the element region 23 may be formed in the p type well 22 which is arranged in the n type well 21. Such an example is illustrated in FIG. 25. As illustrated in FIG. 25, a triple well is formed in the region 150, and the element region 23 is arranged therein.

In addition, for example, in the embodiments described above, VERA may be applied to the triple well region 300 at the time of erasing the data, and VERA may be applied to the node VHSA, the node VLSA, and the node SRCGND. Such an example is illustrated in FIG. 26.

Figure 26:
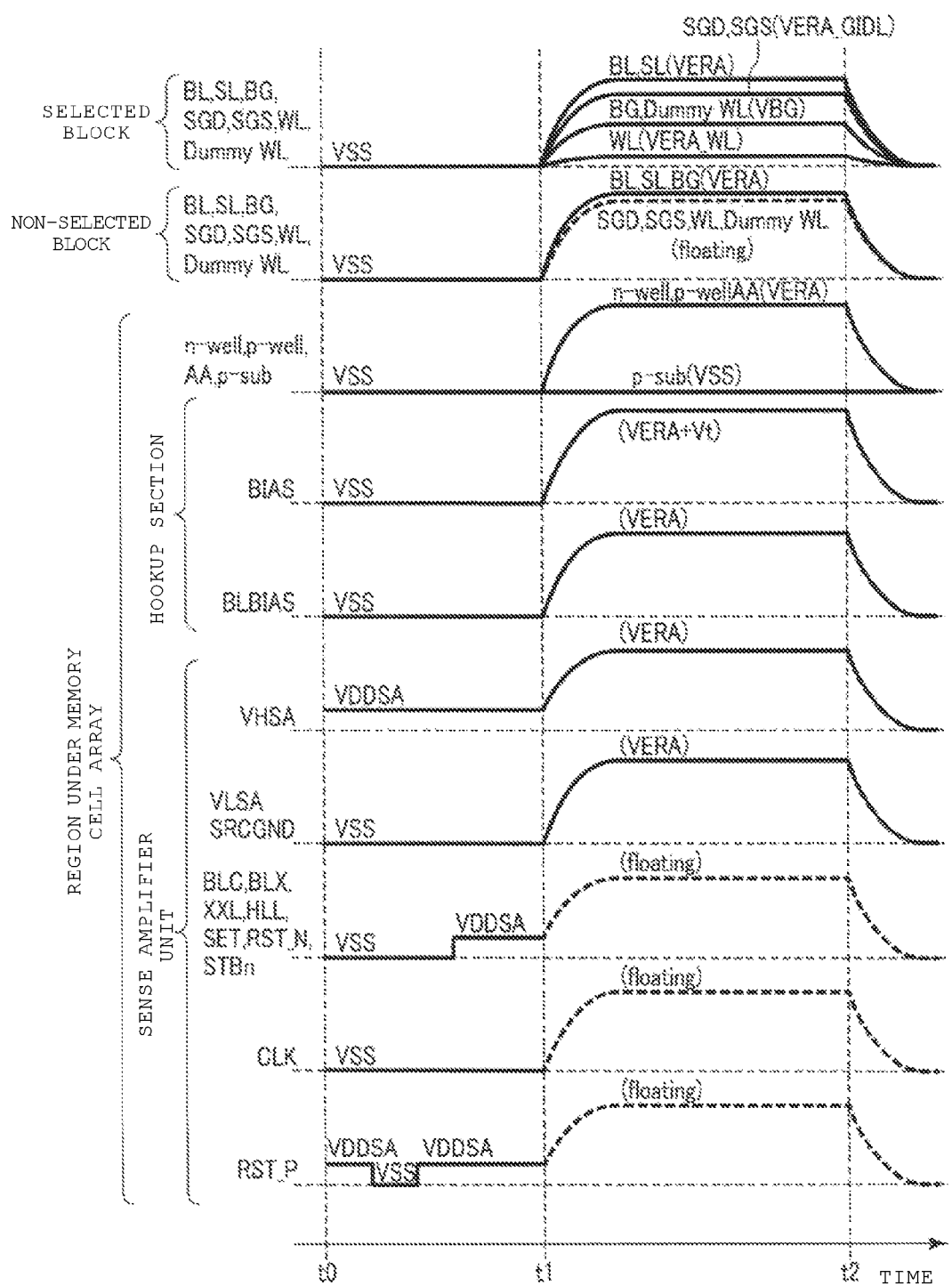
FIG. 26 is a timing diagram illustrating a potential of various lines at the time of erasing of a semiconductor memory device according to a modification example of the second embodiment.

As illustrated in FIG. 26, the driver 123 applies VERA to the n type well 21 and the p type well 22 of the triple well region 300 from the time t1 to a time t2 at the time of erasing the data.

In addition, VERA is applied to the node VERA, the node VLSA, and the node SRCGND. Accordingly, even when the potential of the signal line which is connected to each of the gates increases, for example, to VERA due to the capacitance coupling, the potential of the node which is connected to the back gate of the transistor and the source and the drain of the transistor also increases to VERA, and thus it is possible to prevent a high voltage from being applied to the low breakdown voltage transistor in the sense amplifier 113.

In addition, in the embodiments described above, for example, a voltage-sensing sense amplifier may be used.

Further, the "connection" in the embodiments described above includes an indirectly connected state in which, for example, others such as a transistor or resistance are interposed in the connection.

Furthermore, in each of the embodiments, the followings may be included.

1) In the reading operation, a reading operation time (tR), for example, may be 25 μs to 38 μs, 38 μs to 70 μs, and 70 μs to 80 μs.

(2) The writing operation includes a program operation and a verify operation as described above. In the writing operation, a voltage which is initially applied to the word line selected at the time of performing the program operation, for example, is 13.7 V to 14.3 V. The voltage is not limited thereto, and for example, may be either 13.7 V to 14.0 V or 14.0 V to 14.6 V.

A voltage which is initially applied to the word line selected at the time of performing writing with respect to an odd-numbered word line, and a voltage which is initially applied to word line selected at the time of performing writing with respect to an even-numbered word line may be changed.

When the program operation is an incremental step pulse program (ISPP) type operation, a step-up voltage, for example, is approximately 0.5 V.

A voltage applied to the non-selected word line, for example, may be 6.0 V to 7.3 V. The voltage is not limited thereto, and for example, may be 7.3 V to 8.4V, or may be less than or equal to 6.0 V.

A path voltage to be applied may be changed according to whether the non-selected word line is the odd-numbered word line or the even-numbered word line.

A writing operation time (tProg), for example, may be 1,700 µs to 1,800 µs, 1,800 µs to 1,900 µs, and 1,900 µs to 2,000 µs.

(3) In the erasing operation, a voltage initially applied to the well which is formed on an upper portion of the semiconductor substrate and includes the memory cell arranged thereon, for example, is 12 V to 13.6 V. The voltage is not limited thereto, and for example, may be 13.6 V to 14.8 V, 14.8 V to 19.0 V, 19.0 V to 19.8 V, and 19.8 V to 21 V.

An erasing operation time (tErase), for example, may be 3,000 µs to 4,000 µs, 4,000 µs to 5,000 µs, and 5,000 µs to 9,000 µs.

4) The structure of the memory cell includes the charge storage layer which is arranged on the semiconductor substrate (a silicon substrate) through the tunnel insulating film having a film thickness of 4 nm to 10 nm. The charge storage layer is able to have a structure in which an insulating film of SiN, SiON, or the like having a film thickness of 2 nm to 3 nm and polysilicon having a film thickness of 3 nm to 8 nm are stacked. In addition, metal such as Ru may be added to the polysilicon. The insulating film is included on the charge storage layer. The insulating film, for example, includes a silicon oxide film having a film thickness of 4 nm to 10 nm which is interposed between a lower layer High-k film having a film thickness of 3 nm to 10 nm and an upper layer High-k film having a film thickness of 3 nm to 10 nm. As the material of the High-k film, HfO and the like are included. In addition, the film thickness of the silicon oxide film may be thicker than that of the High-k film. A control electrode having a film thickness of 30 nm to 70 nm is formed on the insulating film through a material having a film thickness of 3 nm to 10 nm. Here, such material is a metal oxide film of TaO or the like, and a metal nitride film of TaN or the like. In the control electrode, W and the like are able to be used.

In addition, an air gap is able to be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first well of a first conductivity type;
a second well of a second conductivity type in the first well;
a memory cell array including a plurality of memory cells stacked above the first well and the second well, the memory cells including a first memory cell transistor;
a first wiring above the memory cell array and electrically connected to the first memory cell transistor;
a first sense amplifier electrically connected to the first wiring and located below the memory cell array; and
a controller configured to execute an erase operation in which an erase voltage is applied to the first wiring while the first well is in an electrically floating state.

2. The device according to claim 1, further comprising:
a transistor electrically connected between a power supply and the first well, the transistor being turned off during the erase operation to cause the potential of the first well to be in the electrically floating state.

3. The device according to claim 2,
wherein a potential of the first well increases from a first potential to a second potential when the erase voltage is applied to the first wiring.

4. The device according to claim 3, wherein
the second potential is higher than a potential of the power supply.

5. The device according to claim 1, wherein transistors of the first sense amplifier have channel regions formed in the second well.

6. The device according to claim 5, wherein
a potential of the second well increases to the second potential during the erase operation.

7. The device according to claim 1, wherein
the memory cell array further includes a first block that includes a first memory string including the first memory cell transistor and a first select transistor, and a second block that includes a second memory string including a second memory cell transistor and a second select transistor, and
during the erase operation, first conductive lines electrically connected to gates of the first select transistor and the first select transistor are not in an electrically floating state, and second conductive lines electrically connected to gates of the second select transistor and the second select transistor are in an electrically floating state.

8. The device according to claim 7, further comprising:
a first source line electrically connected to the first block;
a second source line electrically connected to the second block;
a first switch circuit between the first sense amplifier and the first source line; and
a second switch circuit between the first sense amplifier and the second source line.

9. The device according to claim 8, further comprising:
a second wiring above the memory cell array and electrically connected to the second memory cell transistor; and
a second sense amplifier electrically connected to the second wiring, wherein
the first switch circuit is between the second sense amplifier and the first source line; and the second switch circuit is between the sense second amplifier and the second source line.

10. A method of executing an erase operation in a semiconductor memory device including a first well of a first conductivity type, a memory cell array including a plurality of memory cells stacked above the first well, the memory cells including a first memory cell transistor, and a first wiring above the memory cell array and electrically connected to the first memory cell transistor, said method comprising:
turning off a transistor that is electrically connected between a power supply and the first well to cause the first well to be in an electrically floating state; and
applying an erase voltage to the first wiring, the erase voltage applied to the first wiring increasing a potential of the first well by capacitive coupling.

11. The method according to claim 10,
wherein a potential of the first well increases from a first potential to a second potential when the erase voltage is applied to the first wiring, the second potential being higher than a potential of the power supply.

12. The method according to claim 10, wherein semiconductor memory device further includes:
a second well of a second conductivity type in the first well; and
a first sense amplifier electrically connected to the first wiring and located below the memory cell array.

13. The method according to claim 12, wherein transistors of the first sense amplifier have channel regions formed in the second well.

14. The method according to claim 13, wherein
a potential of the second well increases to the second potential during the erase operation.

15. The method according to claim 10, wherein
the memory cell array further includes a first block that includes a first memory string including the first memory cell transistor, and a first select transistor, and a second block that includes a second memory string including a second memory cell transistor, and a second select transistor, and
during the erase operation, first conductive lines electrically connected to gates of the first select transistor and the first select transistor are not in an electrically floating state, and second conductive lines electrically connected to gates of the second select transistor and the second select transistor are in an electrically floating state.

16. The method according to claim 15, wherein semiconductor memory device further includes:
a first source line electrically connected to the first block;
a second source line electrically connected to the second block;
a first switch circuit between the first sense amplifier and the first source line; and
a second switch circuit between the first sense amplifier and the second source line.

17. The method according to claim 16, wherein semiconductor memory device further includes:
a second wiring above the memory cell array and electrically connected to the second memory cell transistor; and
a second sense amplifier electrically connected to the second wiring, wherein
the first switch circuit is between the second sense amplifier and the first source line; and
the second switch circuit is between the sense second amplifier and the second source line.

* * * * *